United States Patent [19]
Matsumoto et al.

[11] Patent Number: 5,978,402
[45] Date of Patent: Nov. 2, 1999

[54] SEMICONDUCTOR LASER DEVICE

[75] Inventors: Keisuke Matsumoto; Takashi Nishimura, both of Tokyo, Japan

[73] Assignee: Mitsubishi Denki Kabushiki Kaisha, Tokyo, Japan

[21] Appl. No.: 08/879,615

[22] Filed: Jun. 20, 1997

[30] Foreign Application Priority Data

Apr. 26, 1999 [JP] Japan .................................... 8-330095

[51] Int. Cl.⁶ ........................................................ H01S 3/19
[52] U.S. Cl. ................................ 372/50; 372/45; 372/48; 372/96; 437/133; 331/94.5
[58] Field of Search ................................ 372/50, 45, 48, 372/96; 331/94.5; 437/133

[56] References Cited

U.S. PATENT DOCUMENTS

| | | | |
|---|---|---|---|
| 3,993,963 | 11/1976 | Logan et al. | 331/94.5 |
| 4,961,198 | 10/1990 | Ishino et al. | 372/50 |
| 5,764,670 | 6/1998 | Ouchi | 372/45 |

FOREIGN PATENT DOCUMENTS

| | | |
|---|---|---|
| 64-289984 | 1/1989 | Japan . |
| 7193210 | 7/1995 | Japan . |

OTHER PUBLICATIONS

Aoki et al., "InGaAs/InGaAsP MQW Electroabsorption Modulator Integrated With A DFB Laser Fabricated By Band–Gap Energy Control Selective Area MOCVD", IEEE Journal of Quantum Electronics, vol. 29, No. 6, Jun. 1993, pp. 2088–2096.

Aoki et al., "High–Speed (10Gbit/s) And Low–Drive–Voltage (1 V Peak To Peak) InGaAs/InGaAsP MQW Electroabsorption–Modulator Integrated DFB Laser With Semi–Insulating Buried Heterostructure", Electronics Letters, vol. 28, No. 12, Jun. 1992, pp. 1157–1158.

*Primary Examiner*—Rodney Bovernick
*Assistant Examiner*—Sung T. Kim
*Attorney, Agent, or Firm*—Leydig, Voit & Mayer, Ltd

[57] ABSTRACT

An integrated modulator and semiconductor laser device includes a semiconductor substrate; an optical waveguide including an active layer having a width and a cladding layer, and disposed on the semiconductor substrate, the optical waveguide including a laser part and a modulator part modulating the intensity of laser light; a semi-insulating semiconductor layer disposed on opposite sides of the optical waveguide; a low-resistance contact layer for making an ohmic contact with an electrode material, disposed on the optical waveguide, being absent between the laser part and the modulator part, and having a width equivalent to the width of the active layer. Since the contact layer with a stripe structure having a width equivalent to that of the active layer is used in making ohmic contact to the electrode material, the cladding layer of the second conductivity type below the contact layer is narrowed as well, and the isolation between the laser and the modulator is also improved with good controllability without narrowing by etching. The flow of current between the contact layer of the laser part and the contact layer of the modulator part is reduced. As a result, the isolation between the laser part and the modulator part is improved by one order of magnitude over the prior art semiconductor laser device.

6 Claims, 25 Drawing Sheets

SEMICONDUCTOR LASER DEVICE

FIELD OF THE INVENTION

The present invention relates to an integrated modulator and semiconductor laser device that is capable of high speed operation and is employed as a transmitter in optical communications. More particularly, the invention relates to a semiconductor laser device with a structure for enhancing isolation between the semiconductor laser and the modulator.

BACKGROUND OF THE INVENTION

Recently, developments of a semiconductor laser device integrating a semiconductor laser and a modulator have been advanced, intended for an application to optical communications. In this device, a distributed feedback laser diode (DFB LD) is operated with direct current and light emitted from the laser diode is subjected to high speed modulation by a light absorption modulator.

FIGS. 24(a)–24(c) are diagrams illustrating a prior art integrated modulator and semiconductor laser device. FIG. 24(a) is a perspective view of the semiconductor laser device, FIG. 24(b) is a cross-sectional view of the device taken along a line 24b—24b, at the isolation part between the laser and the modulator, and FIG. 24(c) is a cross-sectional view of the device taken along a line 24c—24c in the resonator length direction.

In these figures, reference numeral 1 designates an n type InP substrate. A ridge, i.e., optical waveguide, comprising an active layer 2 and a p type InP cladding layer 3 is disposed on the semiconductor substrate 1. This ridge includes a semiconductor laser part (a), and a modulator part (c) having a diffraction grating (not shown) at the surface of the semiconductor substrate 1 beneath the active layer 2. Burying layers comprising an Fe-doped InP semi-insulating semiconductor layer 6a, an n type InP hole trap layer 8 and an Fe-doped InP semi-insulating semiconductor layer 6b, successively formed, are disposed on both sides of the ridge. A p type InP cladding layer 10 and a p type InGaAs contact layer 4 are successively disposed on the ridge and on the burying layers. The contact layer 4 is absent at an isolation part (b) between the laser part (a) and the modulator part (c). The entire surface of the wafer, except for portions of the contact layer 4, is covered with an insulating film 7.

A description is given of the operation.

Since this semiconductor laser device has a diffraction grating beneath the active layer 2 of the modulator part (c), laser oscillation at a single wavelength is stably performed employing the diffraction grating. The active layer 2 of the laser part (a) and the active layer, i.e., light absorption layer, 2 of the modulator part (c) comprise a continuous InGaAs/InGaAsP multiple quantum well layer. The energy difference between normal levels of the conduction band and the valence band in the quantum well of the laser part (a) is smaller than that of the modulator part (c). Therefore, when no bias voltage is applied to the modulator part (c), light from the laser part (a) is not absorbed in the light absorption layer 2. However, if reverse bias voltage is applied to the modulator part (c), the light is absorbed due to quantum confined Stark effect (QCSE). Consequently, the light emitted from the laser part (a) which is operated with direct current, can be modulated by changing the bias voltage which is applied to the modulator part (c).

In addition, the Fe-doped InP semi-insulating semiconductor layers 6a and 6b and the n type InP hole trap layer 8 fill in both sides of the ridge waveguide comprising the active layer 2, and the InP cladding layer 3 and the InP substrate 1 respectively disposed above and below the active layer 2, and function as a current blocking layer. Because Fe produces a deep acceptor in InP, the Fe-doped InP semi-insulating semiconductor layer 6a can block diffusion of electrons from the n type InP substrate 1. The n type InP hole trap layer 8 can block diffusion of holes from the p type InP cladding layer 10. Thereby, the threshold current of the laser is reduced and the efficiency of the laser is enhanced.

A description is given of the fabricating method.

FIGS. 21(a)–21(c), 22(a)–22(c) and 23(a)–23(c) are diagrams illustrating respective states of process steps in the fabricating method.

Initially, after forming the diffraction grating in a region of the n type InP semiconductor substrate 1 where the modulator is to be formed, the active layer 2 comprising an InGaAs/InGaAsP multiple quantum well layer and the cladding layer 3 comprising, for example, p type InP, are grown on the substrate 1 by MOCVD. Then, an insulating film stripe 5 having a width of 1~2 μm is formed on the cladding layer 3. Using this stripe 5 as a mask, dry etching is performed to form a ridge having a height of about 2~3 μm, thereby providing an optical waveguide (FIGS. 21(a)–21(c)). Thereafter, the Fe-doped InP semi-insulating semiconductor layer 6a, the n type InP hole trap layer 8 and the Fe-doped InP semi-insulating semiconductor layer 6b are successively grown on both sides of the ridge (FIGS. 22(a)–22(c)). After removal of the insulating film stripe 5, the p type InP cladding layer 10 and the p type InGaAs contact layer 4 are successively grown by MOCVD (FIGS. 23(a)–23(c)). Then, the contact layer 4 at the isolation part (b) between the semiconductor laser part (a) and the modulator part (c) is etched and removed. Further, in order to make the capacitance lower, opposite sides of the active layer 2 are etched to form a mesa shape. In this etching, the ridge width of the contact layer 4 is 10~20 μm, and the etching range of the contact layer 4 in the resonator length direction, is 10~50 μm. The entire surface of the wafer, except for portions of the contact layer 4, is covered with the insulating film 7, completing the semiconductor laser device shown in FIG. 24(a). In addition, an electrode for making an ohmic contact is formed on the portions of the contact layer 4 unmasked with the insulating film 7.

In the integrated modulator and semiconductor laser device, since the semiconductor laser part is forward biased and the modulator part is reversely biased, sufficient electrical isolation between the laser part and the modulator part is required. Generally, an oscillation wavelength of a semiconductor laser varies with varying injection current. In the integrated modulator and semiconductor laser device, however, the laser part is driven with a constant current. Thus, if the electrical isolation between the laser part and the modulator part is insufficient, the current flowing through the laser part is unfavorably varied by a modulation signal which is applied to the modulator part via the isolation resistance between the laser part and the modulator part, thereby resulting in wavelength variation. This wavelength variation causes degradation of a transmitted waveform during long-distance transmission through an optical fiber, resulting in limited transmission distance. Consequently, in order to improve transmission characteristics, it is very important to enhance the isolation resistance between the laser part and the modulator part.

On the other hand, the mobility of electrons is tremendously larger than that of holes in InP. This results in low electrical resistance of the n type InP hole trap layer 8 in the above-described semiconductor laser device. In addition, the hole trap layer 8 is continuous through the modulator part (c) and the laser part (a). This results insufficient electrical isolation between the modulator part (c) and the laser part (a), and there occurs mutual interference between these parts. Further, the semi-insulating semiconductor layer 6b forms a capacitance. Accordingly, when the hole trap layer 8 is continuous through the modulator and laser parts, the capacitances of the semi-insulating semiconductor layer 6b are coupled, thereby increasing parasitic capacitance of the modulator part (c) and impeding modulation operation at harmonics.

The following are semiconductor laser devices which avoid these problems.

A semiconductor laser device shown in FIG. 25 integrates a laser part (a) and a modulator part (c). The laser and modulator parts (a) and (c) are both disposed on a semiconductor substrate 100. The laser part (a) includes optical waveguide layers 15 and 16 and a quantum well layer 50a, and the modulator part (c) includes optical waveguide layers 15 and 16 and a quantum well layer 50b and has a diffraction grating 12 formed on the semiconductor substrate 100. $P^+$ type InGaAsP layers 70 are disposed on the laser and modulator parts (a) and (c) and electrodes 91a and 91b are disposed on the $p^+$ type InGaAsP layers 70. There is an isolation part (b) comprising a p type InP layer 65 having a larger band gap energy than those of the optical waveguide layers 15 and 16, provided between the laser part (a) and the modulator part (c). This p type InP layer 65 of the isolation part (b) increases the isolation resistance between the laser part (a) and the modulator part (c).

A semiconductor laser device shown in FIG. 26 is provided with a laser part (a) and a modulator part (c) on a semiconductor substrate 101. In the laser part (a), a first optical guide layer 102, a first buffer layer 103, a second optical guide layer 106, a cladding layer 107 and a cap layer 108 are successively disposed on the semiconductor substrate 101. The modulator part (c) has a diffraction grating 12 formed on the semiconductor substrate 101, the first optical guide layer 102 and the first buffer layer 103, which are continuous with the respective layers of the laser part (a), disposed on the semiconductor substrate 101. An active layer 104, a second optical buffer layer 105, a second optical guide layer 106, a cladding layer 107 and a cap layer 108 are successively disposed on the first buffer layer 103. There is an isolation part (b) filled with a high resistance semiconductor 109 between the laser part (a) and the modulator part (c). This high resistance semiconductor 109 increases the isolation resistance between the laser part (a) and the modulator part (c).

A semiconductor laser device shown in FIG. 27 includes a ridge, i.e., optical waveguide, 140 comprising an active layer 110, 400 and a cladding layer 350 that is disposed on a semiconductor substrate 200. The ridge 140 includes a semiconductor laser part 1010 and a modulator part 1020 having a diffraction grating 120 on the semiconductor substrate 200 beneath the active layer 110. Burying layers comprising a semi-insulating semiconductor layer 800 and a hole trap layer 900, which are successively formed, are disposed on both sides of the ridge 140. Electrodes 300 and 700 are disposed on the lower and upper surfaces of the semiconductor laser device, respectively. In this semiconductor laser device, the cladding layer 350, the hole trap layer 900 and the semi-insulating semiconductor laser 800 between the laser part 1010 and the modulator part 1020 are etched and removed, thereby increasing the isolation resistance between the laser part 1010 and the modulator part 1020.

In the semiconductor laser devices shown in FIGS. 25 and 26, however, the active layers in the laser part (a) and the modulator part (c) are separated from each other. Therefore, the optical coupling efficiency between the laser part (a) and the modulator part (c) is low.

In the semiconductor laser device shown in FIG. 27, the cladding layer 350 above the ridge 140 is employed to make an ohmic contact with the electrode 700. However, since the electrode 700 is disposed in a wide range, current flows between the laser part 1010 and the modulator part 1020 through the electrode 700, thereby reducing the isolation resistance between the laser part 1010 and the modulator part 1020. This results in wavelength variation, and further degradation of the transmitted waveform during long-distance transmission in an optical fiber.

SUMMARY OF THE INVENTION

It is an object of the present invention to provide a semiconductor laser device with a device structure that enhances isolation resistance between a semiconductor laser and an external modulator without reducing optical coupling efficiency between the laser and the modulator.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser device serving as an external modulator integrated semiconductor laser device includes a semiconductor substrate; an optical waveguide comprising an active layer having a width and a cladding layer, and disposed on the semiconductor substrate, the optical waveguide providing a laser part and a modulator part modulating the intensity of laser light; a semi-insulating semiconductor layer disposed on both sides of the optical waveguide; a low-resistance contact layer for making an ohmic contact with an electrode material, disposed on the optical waveguide; the contact layer being absent between the laser part and the modulator part; and the contact layer having a width equivalent to the width of the active layer. As described above, since the contact layer with a stripe structure having the width equivalent to that of the active layer is used in making an ohmic contact with the electrode material, the cladding layer of second conductivity type below the contact layer is narrowed as well, and the isolation part between the laser and modulator is also narrowed with good controllability, without narrowing the isolation part by etching or the like. Thereby, the flow of current between the contact layer of the laser part and the contact layer of the modulator part is reduced. As a result, the isolation resistance between the laser part and the modulator part can be improved by one figure, as compared with the case of the prior art semiconductor laser device.

According to a second aspect of the present invention, the above-described semiconductor laser device includes one selected from protons, helium and oxygen being implanted into the cladding layer between the laser part and the modulator part, thereby making the resistance of the cladding layer between the laser part and the modulator part high. Thereby, the flow of current between the contact layer of the laser part and the contact layer of the modulator part is reduced and the resistance value of the cladding layer at the isolation part between the laser part and the modulator part is increased. Consequently, the isolation resistance between the laser part and the modulator part can be further improved.

According to a third aspect of the present invention, a semiconductor laser device serving as an external modulator integrated semiconductor laser device includes a semiconductor substrate; an optical waveguide comprising an active layer and a cladding layer, and disposed on the semiconductor substrate, the optical waveguide providing a laser part and a modulator part modulating the intensity of laser light; a semi-insulating semiconductor layer disposed on both sides of the optical waveguide; a low-resistance contact layer for making an ohmic contact with an electrode material, disposed on the optical waveguide; the contact layer being absent between the laser part and the modulator part; and a portion of the cladding layer between the laser part and the modulator part being removed, and the semi-insulating semiconductor layer filling in that region where the portion of the cladding layer is removed. As described above, because the portion of the cladding layer between the laser part and the modulator part is removed and the semi-insulating semiconductor layer fills in that region where the portion of the cladding layer is removed, the resistance value of the isolation part between the laser part and the modulator part is increased. Consequently, the isolation resistance between the laser part and the modulator part can be improved.

According to a fourth aspect of the present invention, a semiconductor laser device serving as an external modulator integrated semiconductor laser device includes a semiconductor substrate; an optical waveguide comprising an active layer having a width and a cladding layer, and disposed on the semiconductor substrate, the optical waveguide providing a laser part and a modulator part modulating the intensity of laser light; a semi-insulating semiconductor layer disposed on both sides of the optical waveguide; a low-resistance contact layer for making an ohmic contact with an electrode material, disposed on the optical waveguide; the contact layer being absent between the laser part and the modulator part; the contact layer having a width equivalent to the width of the active layer; and a portion of the cladding layer between the laser part and the modulator part being removed, and the semi-insulating semiconductor layer filling in that region where the portion of the cladding layer is removed. Thereby, the flow of current between the contact layer of the laser part and the contact layer of the modulator part is reduced. Because the portion of the cladding layer between the laser part and the modulator part is removed and the semi-insulating semiconductor layer fills in that region where the portion of the cladding layer is removed, the resistance value of the isolation part between the laser part and the modulator part is increased. Consequently, the isolation resistance between the laser part and the modulator part can be further improved.

According to a fifth aspect of the present invention, a semiconductor laser device serving as an external modulator integrated semiconductor laser device includes a semiconductor substrate; an optical waveguide comprising an active layer and a cladding layer, and disposed on the semiconductor substrate, the optical waveguide providing a laser part and a modulator part modulating the intensity of laser light; a semi-insulating semiconductor layer disposed on both sides of the optical waveguide; a low-resistance contact layer for making an ohmic contact with an electrode material, disposed on the optical waveguide; the contact layer being absent between the laser part and the modulator part; and an etch stopping layer being inserted in the cladding layer on the active layer, and the cladding layer between the laser part and the modulator part being removed to reach the etch stopping layer. As described above, by inserting the etch stopping layer in the cladding layer, a portion of the cladding layer is reliably etched and removed as design. Consequently, the isolation resistance between the laser part and the modulator part can be improved.

BRIEF OF DESCRIPTION OF THE DRAWINGS

FIGS. 1(a)–1(c) are a perspective view, and cross-sectional views taken along lines 1b—1b and 1c—1c shown in FIG. 1(a), respectively, illustrating a process step in a method of fabricating a semiconductor laser device in accordance with a first embodiment of the present invention.

FIGS. 2(a)–2(c) are a perspective view, and cross-sectional views taken along lines 2b—2b and 2c—2c shown in FIG. 2(a), respectively, illustrating a process step in the method of fabricating a semiconductor laser device according to the first embodiment of the invention.

FIGS. 3(a)–3(c) are a perspective view, and cross-sectional views taken along lines 3b—3b and 3c—3c shown in FIG. 3(a), respectively, illustrating a process step in the method of fabricating a semiconductor laser device according to the first embodiment of the invention.

FIGS. 4(a)–4(c) are a perspective view, and cross-sectional views taken along lines 4b—4b and 4c—4c shown in FIG. 4(a), respectively, illustrating a semiconductor laser device according to the first embodiment of the invention.

FIGS. 5(a)–5(c) are a perspective view, and cross-sectional views taken along lines 5b—5b and 5c—5c shown in FIG. 5(a), respectively, illustrating a process step in a method of fabricating a semiconductor laser device in accordance with a second embodiment of the present invention.

FIGS. 6(a)–6(c) are a perspective view, and cross-sectional views taken along lines 6b—6b and 6c—6c shown in FIG. 6(a), respectively, illustrating a process step in the method of fabricating a semiconductor laser device according to the second embodiment of the invention.

FIGS. 7(a)–7(c) are a perspective view, and cross-sectional views taken along lines 7b—7b and 7c—7c shown in FIG. 7(a), respectively, illustrating a process step in the method of fabricating a semiconductor laser device according to the second embodiment of the invention.

FIGS. 8(a)–8(c) are a perspective view, and cross-sectional views taken along lines 8b—8b and 8c—8c shown in FIG. 8(a), respectively, illustrating a semiconductor laser device according to the second embodiment of the invention.

FIGS. 9(a)–9(c) are a perspective view, and cross-sectional views taken along lines 9b—9b and 9c—9c shown in FIG. 9(a), respectively, illustrating a process step in a method of fabricating a semiconductor laser device in accordance with a third embodiment of the present invention.

FIGS. 10(a)–10(c) are a perspective view, and cross-sectional views taken along lines 10b—10b and 10c—10c shown in FIG. 10(a), respectively, illustrating a process step in the method of fabricating a semiconductor laser device according to the third embodiment of the invention.

FIGS. 11(a)–11(c) are a perspective view, and cross-sectional views taken along lines 11b—11b and 11c—11c shown in FIG. 11(a), respectively, illustrating a process step in the method of fabricating a semiconductor laser device according to the third embodiment of the invention.

FIGS. 12(a)–12(c) are a perspective view, and cross-sectional views taken along lines 12b—12b and 12c—12c shown in FIG. 12(a), respectively, illustrating a semiconductor laser device according to the third embodiment of the invention.

FIGS. 13(a)–13(c) are a perspective view, and cross-sectional views taken along lines 13b—13b and 13c—13c shown in FIG. 13(a), respectively, illustrating a process step in a method of fabricating a semiconductor laser device in accordance with a fourth embodiment of the present invention.

FIGS. 14(a)–14(c) are a perspective view, and cross-sectional views taken along lines 14b—14b and 14c—14c shown in FIG. 14(a), respectively, illustrating a process step in a method of fabricating a semiconductor laser device in accordance with a fifth embodiment of the present invention.

FIGS. 15(a)–15(c) are a perspective view, and cross-sectional views taken along lines 15b—15b and 15c—15c shown in FIG. 15(a), respectively, illustrating a process step in the method of fabricating a semiconductor laser device according to the fifth embodiment of the invention.

FIGS. 16(a)–16(c) are a perspective view, and cross-sectional views taken along lines 16b—16b and 16c—16c shown in FIG. 16(a), respectively, illustrating a process step in the method of fabricating a semiconductor laser device according to the fifth embodiment of the invention.

FIGS. 17(a)–17(d) are a perspective view, two cross-sectional views taken along a lines 17b—17b and 17c—17c shown in FIG. 17(a), and a cross-sectional view taken along a line 17d—17d shown in FIG. 17(a), respectively, illustrating a process step in the method of fabricating a semiconductor laser device according to the fifth embodiment of the invention.

FIGS. 18(a)–18(d) are a perspective view, two cross-sectional views taken along lines 18b—18b and 18c—18c shown in FIG. 18(a), and a cross-sectional view taken along a line 18d—18d shown in FIG. 18(a), respectively, illustrating a process step in the method of fabricating a semiconductor laser device according to the fifth embodiment of the invention.

FIGS. 19(a)–19(c) are a perspective view, and cross-sectional views taken along lines 19b—19b and 19c—19c shown in FIG. 19(a), respectively, illustrating a semiconductor laser device according to the fifth embodiment of the invention.

FIGS. 20(a)–20(c) are a perspective view, and cross-sectional views taken along lines 20b—20b and 20c—20c shown in FIG. 20(a), respectively, illustrating a semiconductor laser device in accordance with a sixth embodiment of the present invention.

FIGS. 21(a)–21(c) are a perspective view, and cross-sectional views taken along lines 21b—21b and 21c—21c shown in FIG. 21(a), respectively, illustrating a process step in a method of fabricating a semiconductor laser device according to the prior art.

FIGS. 22(a)–22(c) are a perspective view, and cross-sectional views taken along lines 22b—22b and 22c—22c shown in FIG. 22(a), respectively, illustrating a process step in the prior art fabricating method.

FIGS. 23(a)–23(c) are a perspective view, and cross-sectional views taken along lines 23b—23b and 23c—23c shown in FIG. 23(a), respectively, illustrating a process step in the prior art fabricating method.

FIGS. 24(a)–24(c) are a perspective view, and cross-sectional views taken along lines 24b—24b and 24c—24c shown in FIG. 24(a), respectively, illustrating a prior art semiconductor laser device.

DETAILED DESCRIPTION OF THE PREFERRED EMBODIMENTS

[Embodiment 1]

Figure 4:
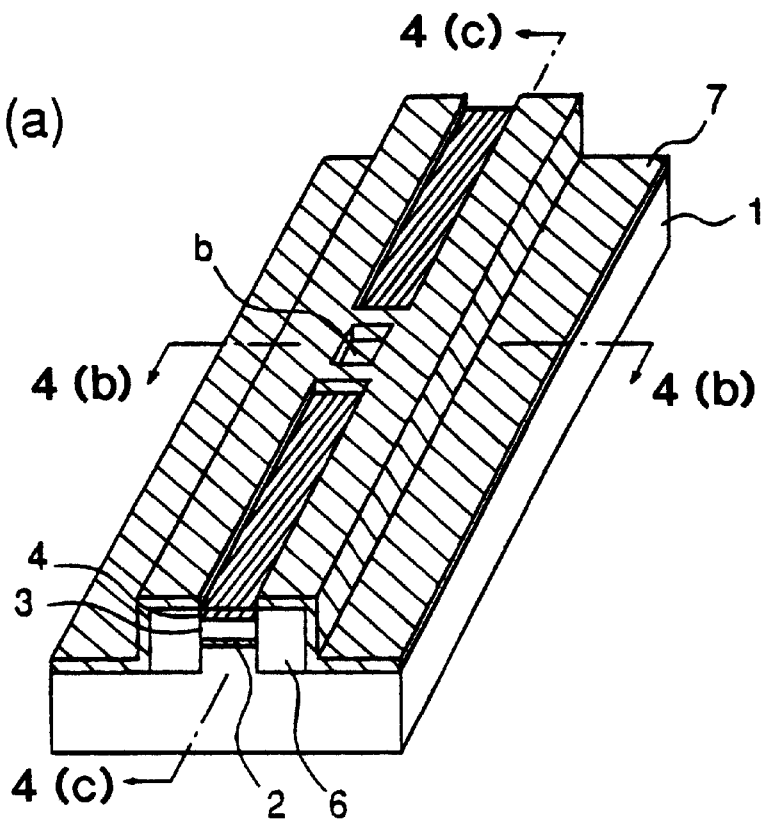
Figure 4:
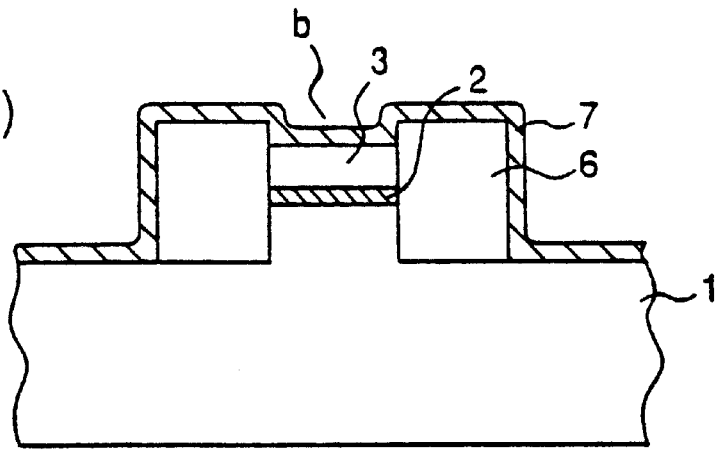
Figure 4:
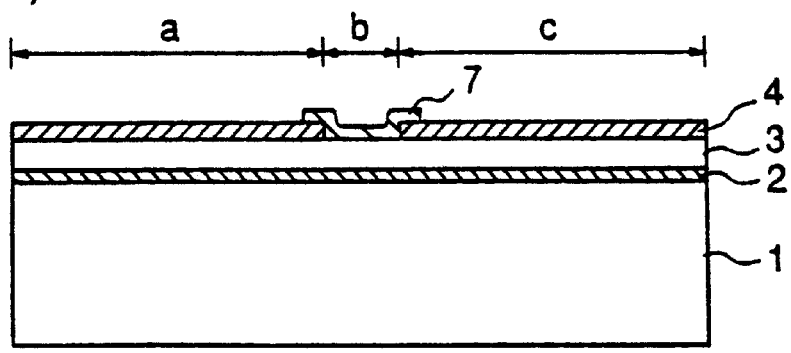
Figure 5:
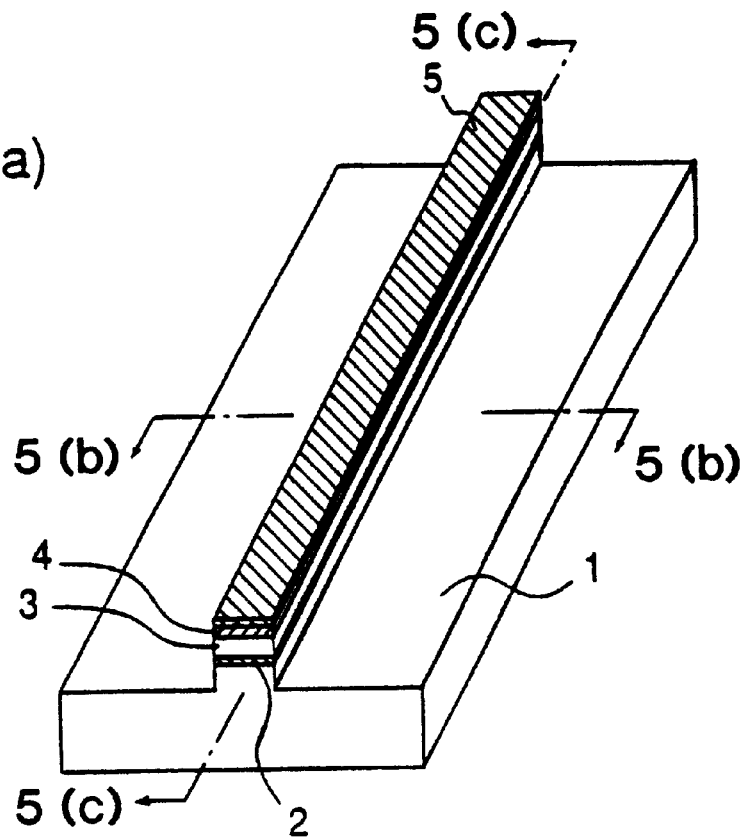
Figure 5:
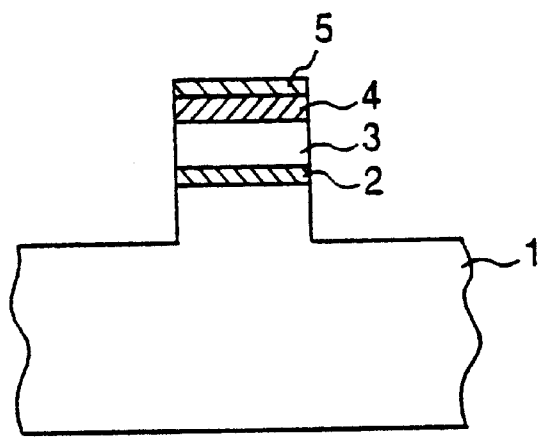
Figure 5:
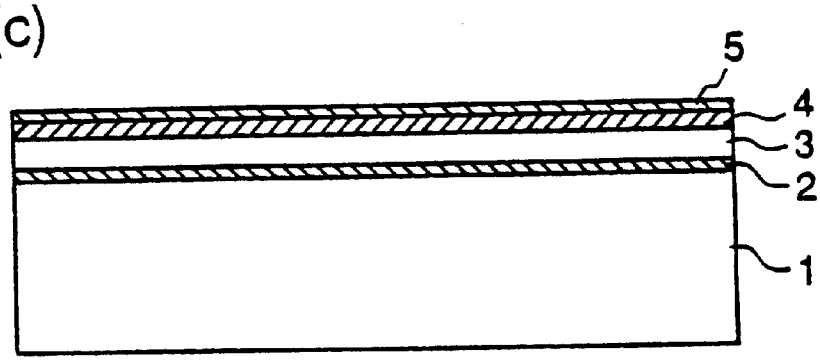

FIGS. 4(a)–4(c) are diagrams illustrating an integrated modulator and semiconductor laser device according to a first embodiment of the present invention. FIG. 4(a) is a perspective view of the semiconductor laser device, FIG. 4(b) shows a cross-section of the device taken along a line 4b—4b at an isolation part between a laser and a modulator, and FIG. 4(c) shows a cross-section of the device taken along a line 4c—4c in the resonator length direction.

In these figures, reference numeral 1 designates an n type InP substrate. A ridge, i.e., optical waveguide, comprising an active layer 2 and a p type InP cladding layer 3 is disposed on the semiconductor substrate 1. This ridge provides a semiconductor laser part (a) and a modulator part (c) having a diffraction grating (not shown) at the surface of the semiconductor substrate 1 beneath the active layer 2. Burying layers comprising an Fe-doped InP semi-insulating semiconductor layer 6 are disposed on both sides of the ridge. A p type InGaAs contact layer 4 having a width equivalent to the width of the active layer 2 is disposed on the ridge. The contact layer 4 is absent at an isolation part (b) between the laser part (a) and the modulator part (c). The entire surface of the wafer, except for the contact layer 4, is covered with an insulating film 7. In addition, the contact layer 4 makes an ohmic contact with an electrode material which is not shown here.

A description is given of the operation.

Since this semiconductor laser device has a diffraction grating beneath the active layer 2 of the modulator part (c), stable single wavelength oscillation is produced due to the diffraction grating. The active layer 2 of the laser part (a) and the active layer, i.e., light absorption layer, 2 of the modulator part (c) comprise a continuous InGaAs/InGaAsP multiple quantum well layer. The energy difference between normal levels of the conduction band and the valence band in the quantum well of the laser part (a) is smaller than that of the modulator part (c). Therefore, when no bias voltage is applied to the modulator part (c), light from the laser part (a) is not absorbed in the light absorption layer 2 of the modulator part (c). However, if reverse bias voltage is applied to the modulator part (c), the light is absorbed due to quantum confined Stark effect (QCSE). Consequently, the light emitted from the laser part (a) which is operated with direct current, can be modulated by changing the bias voltage which is applied to the modulator part (c).

In addition, the Fe-doped InP semi-insulating semiconductor layer 6 fills in both sides of the ridge waveguide comprising the active layer 2, and the InP cladding layer 3 and the InP substrate 1 respectively disposed above and below the active layer 2, and function as a current blocking layer. Because Fe produces a deep acceptor in InP, the Fe-doped InP semi-insulating semiconductor layer 6 can block diffusion of electrons from the n type InP substrate 1. Thereby, the threshold current of the laser is reduced and the efficiency of the laser is improved.

A description is given of the fabricating method.

FIGS. 1(a)–1(c), 2(a)–2(c) and 3(a)–3(c) are diagrams illustrating respective states of process steps in the fabricating method.

Initially, after forming the diffraction grating in a region of the n type InP semiconductor substrate 1 where the modulator is to be formed (not shown), the active layer 2, the p type InP cladding layer 3 and the low-resistance p type InGaAs contact layer 4 are successively grown on the substrate 1 by MOCVD or the like. Then, a stripe of an insulating film 5 having a width of 1~2 μm is formed on the contact layer 4. Using this insulating film 5 as a mask, dry etching is performed to form a ridge serving as an optical waveguide and having a height of about 2~3 μm (FIGS. 1(a)–1(c)).

Figure 1:
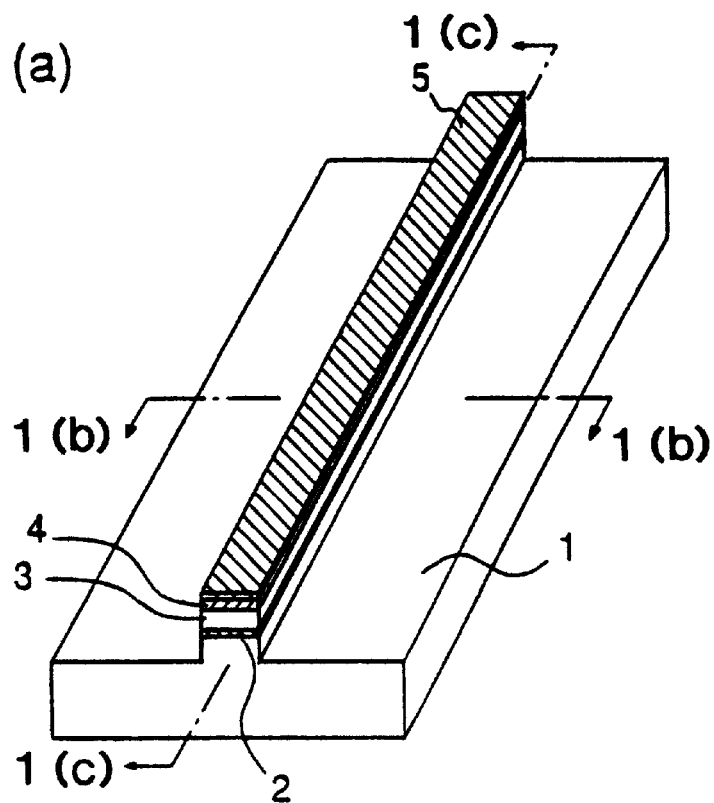
Figure 1:
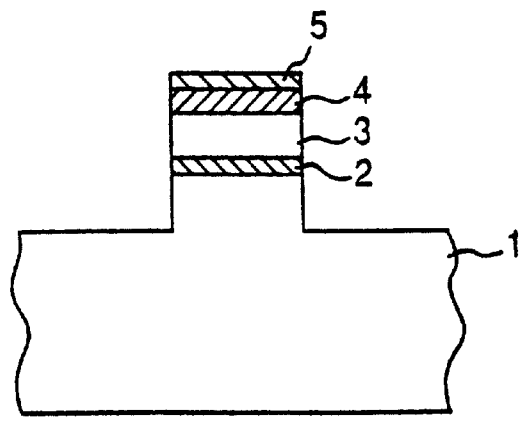
Figure 1:
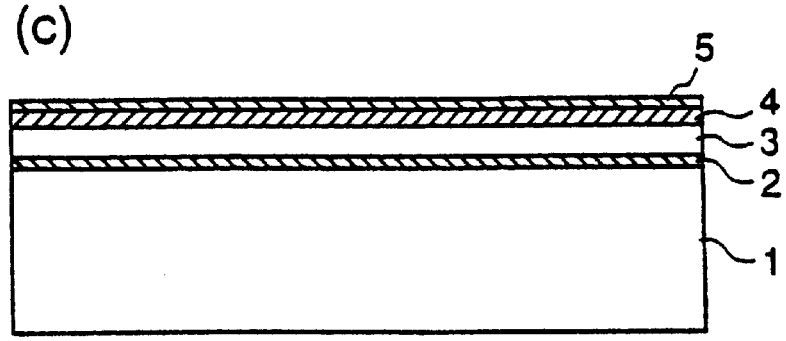
Figure 2:
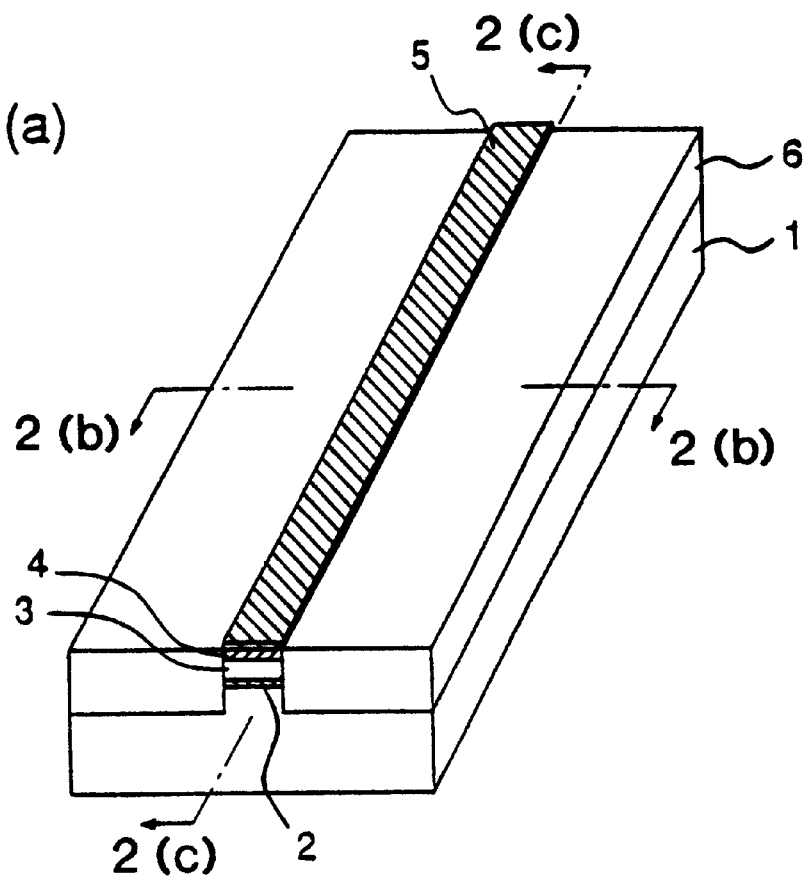
Figure 2:
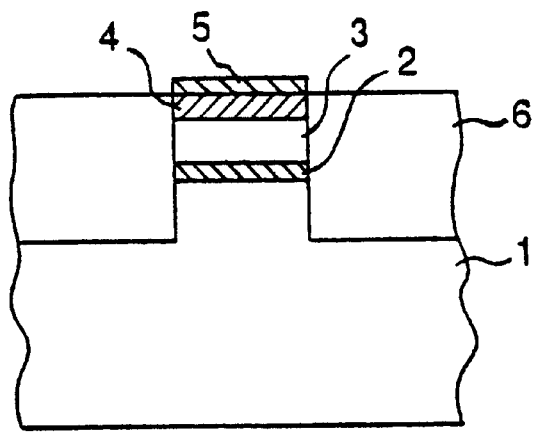
Figure 2:
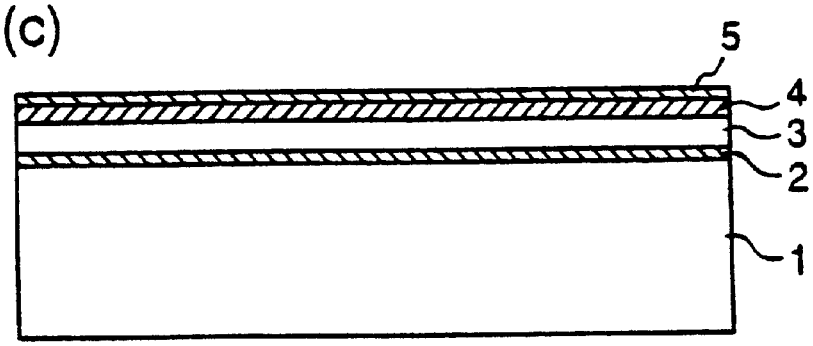

Thereafter, as shown in FIGS. 2(a)–2(c), using the insulating film 5 as a mask for selective growth, the Fe-doped InP semi-insulating semiconductor layer 6 is selectively grown on both sides of the ridge comprising the active layer 2 and the InP layers 1 and 3 by MOCVD or the like.

Figure 3:
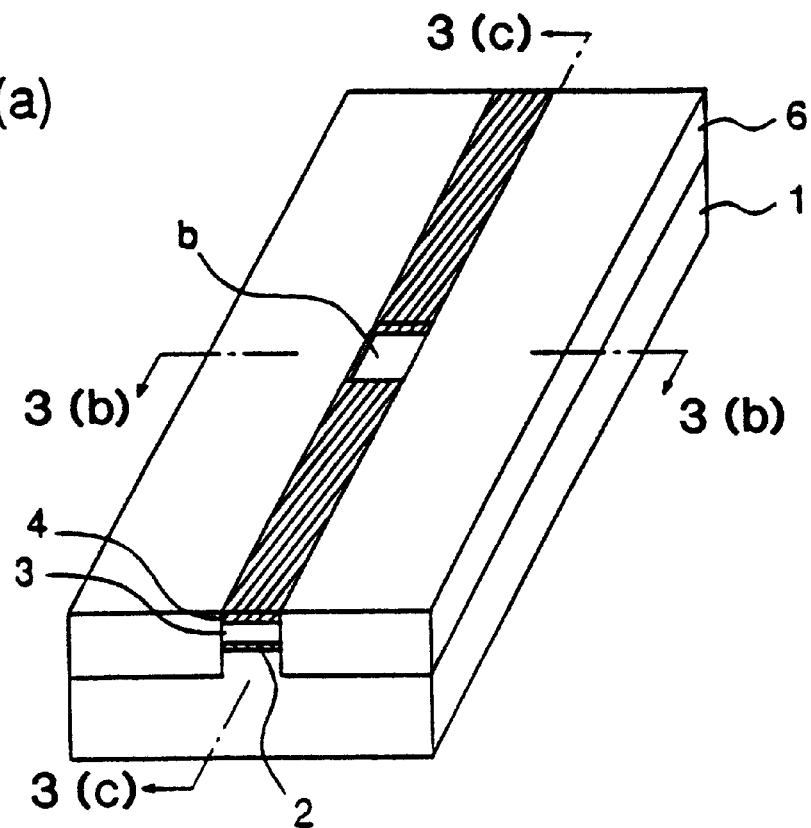
Figure 3:
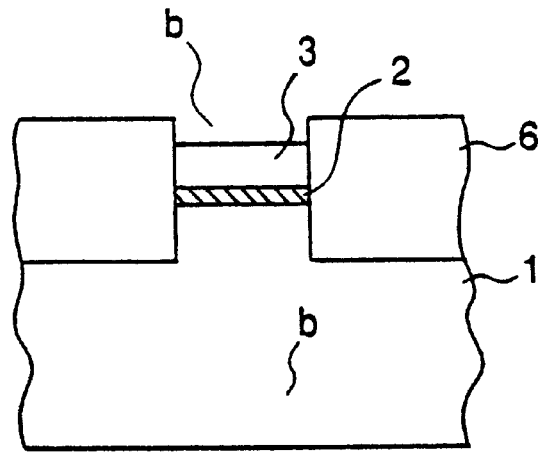
Figure 3:
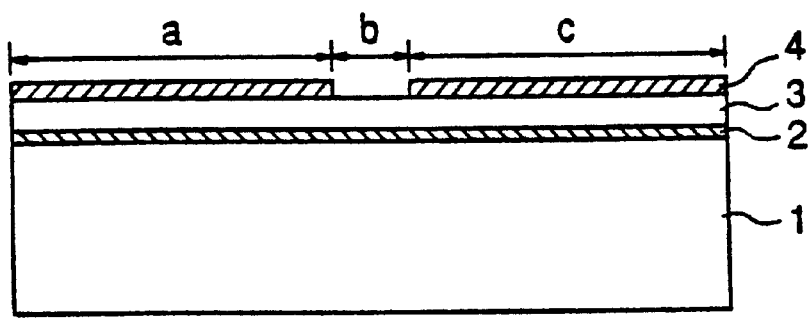

In the step of FIGS. 3(a)–3(c), after removal of the insulating film 5, the contact layer 4 at the isolation part (b) between the semiconductor laser part (a) and the modulator part (c) is etched and removed. In this etching, the etching width in the resonator length direction is 10~50 μm.

Further, in order to make the capacitance of the semiconductor laser device lower, portions of the semi-insulating semiconductor laser 6 on both sides of the active layer 2 are etched to process the wafer into a ridge structure having a width of 5~20 μm. The entire surface of the wafer is covered with the insulating film 7 for protection, and the insulating film 7 on portions of the contact layer 4 is removed, completing the semiconductor laser device shown in FIG. 4(a). In addition, an electrode is formed on the portions of the contact layer 4 not masked by the insulating film 7.

As described above, in the semiconductor laser device according to the first embodiment of the invention, the low-resistance contact layer 4 on the ridge serving as an optical waveguide makes an ohmic contact with the electrode material. After forming the ridge, the semi-insulating semiconductor layer 6 is selectively grown on both sides of the ridge and, finally, the wafer is processed into the ridge type semiconductor laser device. More specifically, in this semiconductor laser device, since the contact layer 4 with a stripe structure having a width of 1~2 μm is used in making an ohmic contact with the electrode material, the p type cladding layer 3 below the contact layer 4 is narrowed to 1~2 μm as well, and the width of the isolation part between the laser part and modulator part is also made 1~2 μm with good controllability, without narrowing the isolation part by etching or the like. Thereby, the flow of current between the contact layer 4 of the laser part (a) and the contact layer 4 of the modulator part (c) is reduced. As a result, the isolation resistance between the laser part (a) and the modulator part (c) can be improved by one order of magnitude, as compared with the case where the contact layer 4 having a width of 10~20 μm is used as in the prior art semiconductor laser device shown in FIG. 24(a).

[Embodiment 2]

Figure 8:
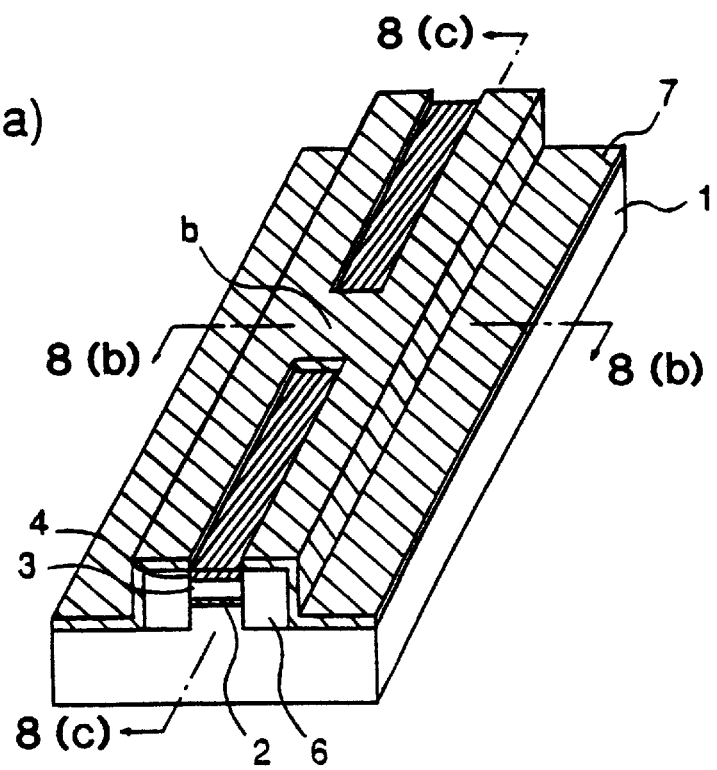
Figure 8:
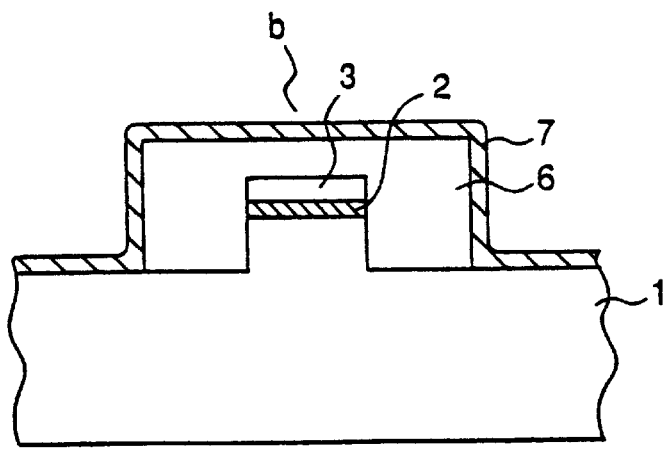
Figure 8:
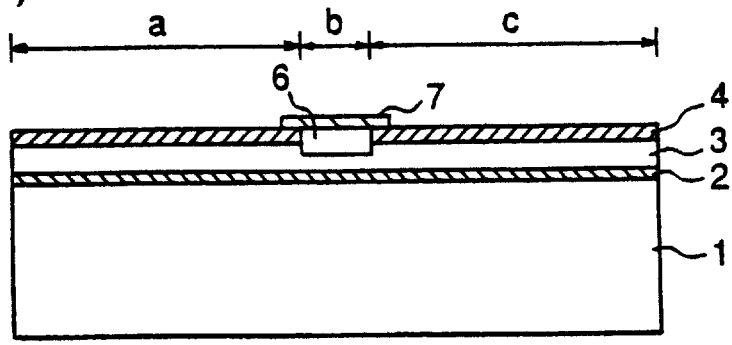
Figure 9:
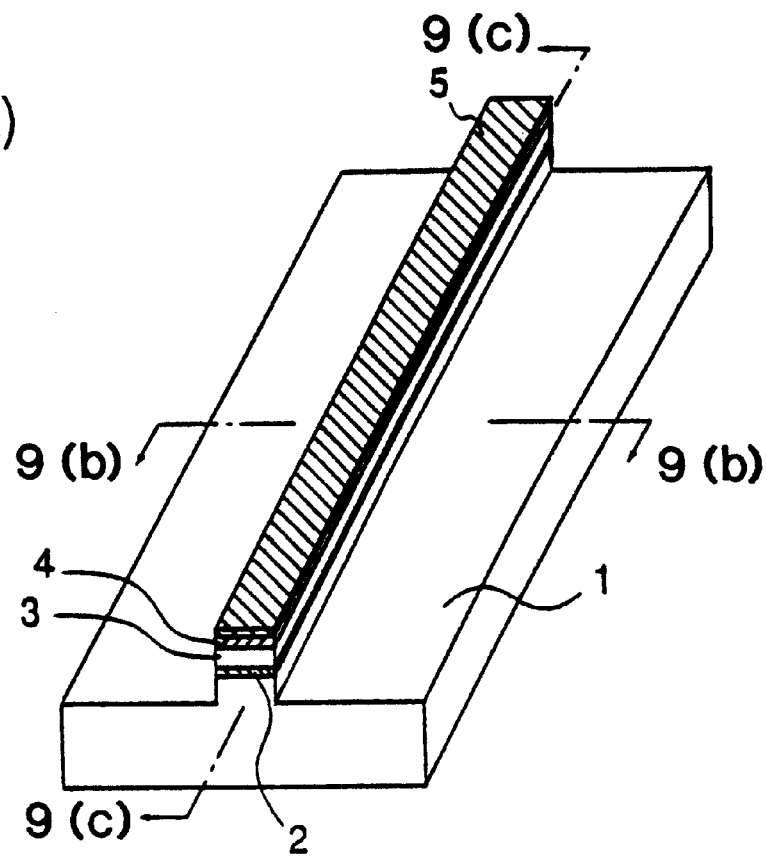
Figure 9:
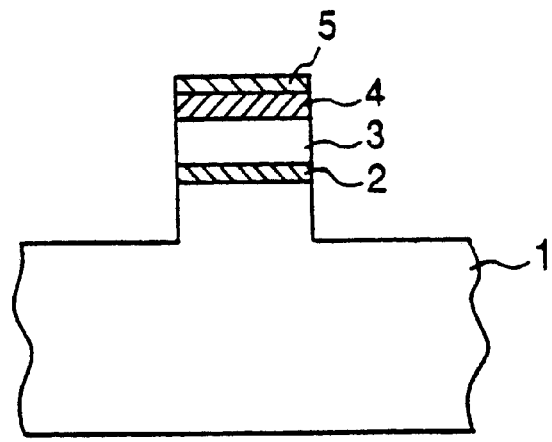
Figure 9:
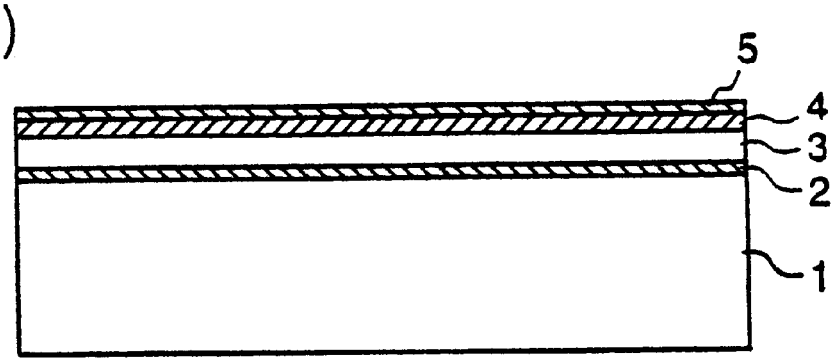

FIGS. 8(a)–8(c) are diagrams illustrating an integrated modulator and semiconductor laser device according to a second embodiment of the present invention. FIG. 8(a) is a perspective view of the semiconductor laser device, FIG. 8(b) shows a cross-section of the device taken along a line 8b—8b at an isolation part between a laser and a modulator, and FIG. 8(c) shows a cross-section of the device taken along a line 8b–8c in the resonator length direction. In these figures, the same reference numerals as those shown in FIGS. 4(a)–4(c) designate the same or corresponding parts.

This semiconductor laser device has a structure fundamentally identical to the structure of the semiconductor laser device according to the first embodiment, except that a portion of the cladding layer 3 between the laser part (a) and the modulator part (c) is absent and the Fe-doped InP semi-insulating semiconductor layer 6 fills in that region where the portion of the cladding layer 3 is absent.

In this semiconductor laser device, as in the semiconductor laser device of the first embodiment, the light emitted from the laser part (a) which is operated with direct current, can be modulated by changing the bias voltage which is applied to the modulator part (c).

A description is given of the fabricating method.

FIGS. 5(a)–5(c), 6(a)–6(c) and 7(a)–7(c) are diagrams illustrating respective process steps in the fabricating method.

Initially, after forming a diffraction grating in a region of the n type InP semiconductor substrate 1 where the modulator is to be formed (not shown), the active layer 2, the p type InP cladding layer 3 and the low-resistance p type InGaAs contact layer 4 are successively grown on the substrate 1 by MOCVD or the like. Then, a stripe of an insulating film 5 having a width of 1~2 μm is formed on the contact layer 4. Using this insulating film 5 as a mask, dry etching is performed to form a ridge serving as an optical waveguide and having a height of about 2~3 μm (FIGS. 5(a)–5(c)).

Figure 6:
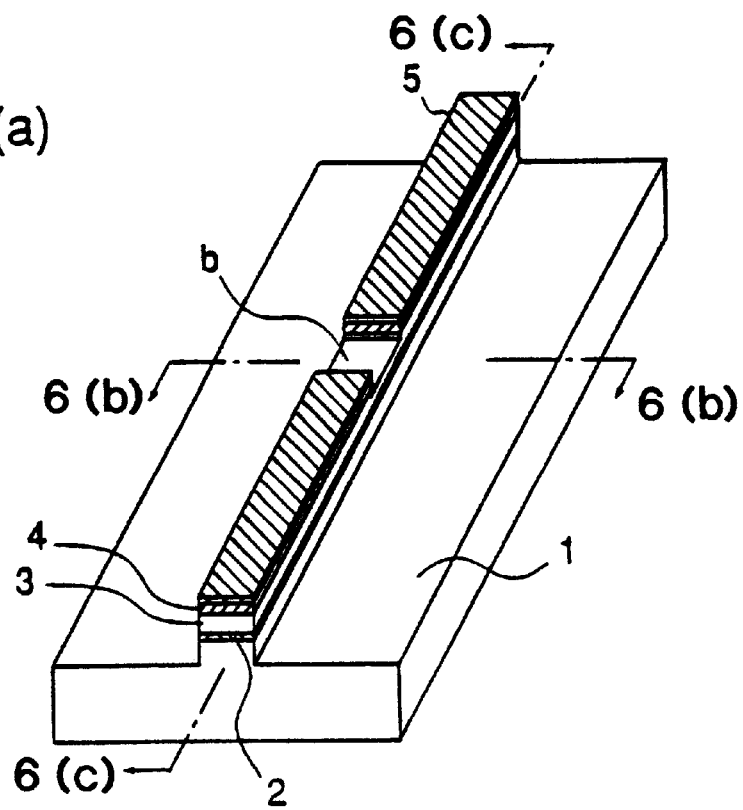
Figure 6:
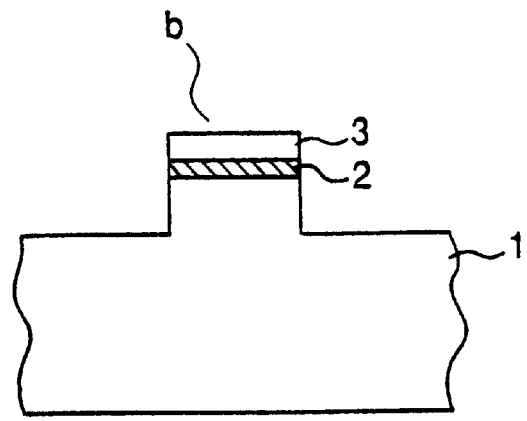
Figure 6:
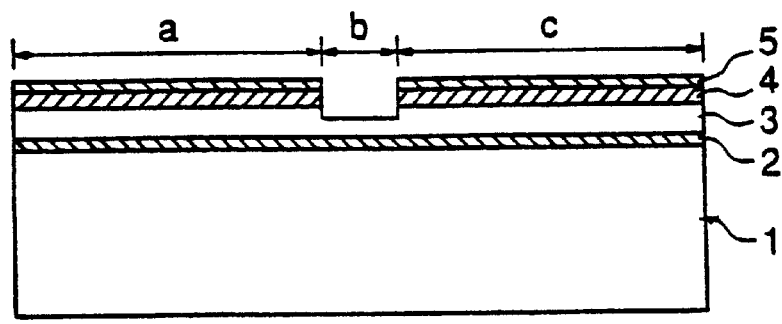

Thereafter, as shown in FIGS. 6(a)–6(c), the insulating film 5, the contact layer 4 and a portion of the cladding layer 3 at the isolation part (b) between the laser part (a) and the modulator part (c) are etched and removed. This etching is not performed to the active layer 2. Thereby, the optical coupling efficiency between the laser part (a) and the modulator part (c) can be maintained to be almost 100%.

Figure 7:
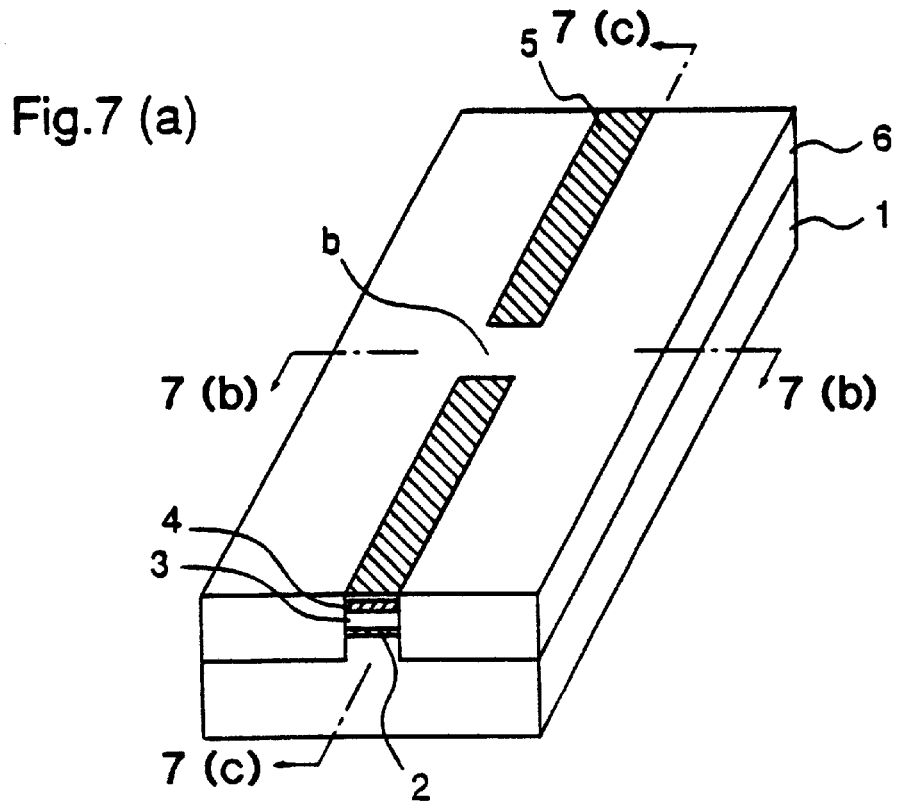
Figure 7:
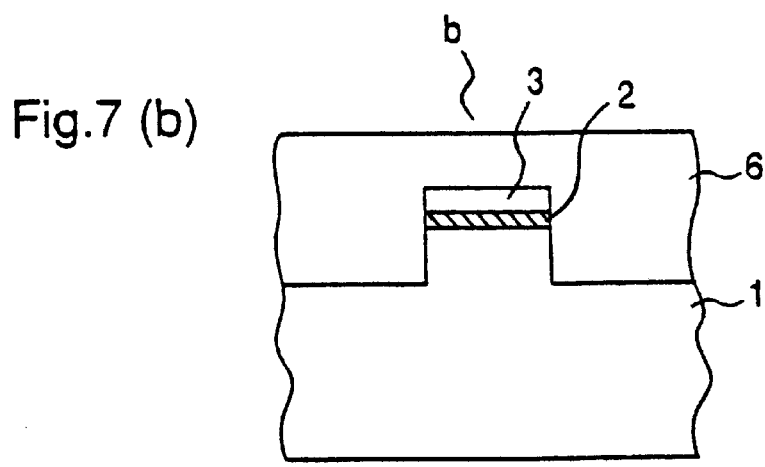
Figure 7:
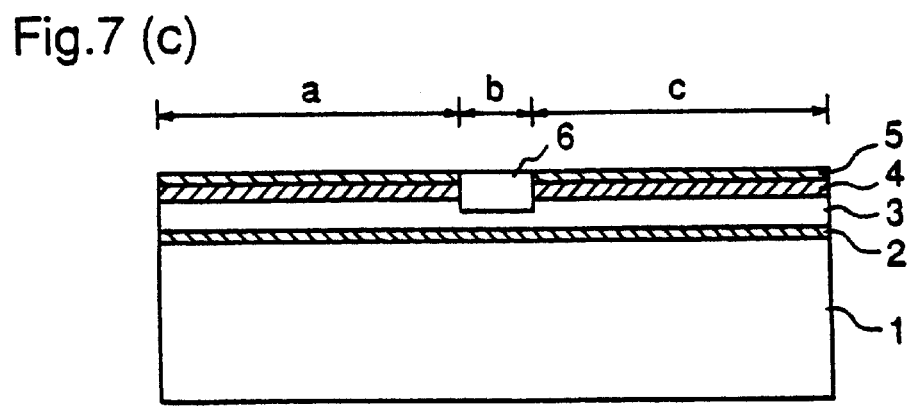

In the step of FIGS. 7(a)–7(c), using the insulating film 5 as a mask for selective growth, the Fe-doped InP semi-insulating semiconductor layer 6 is selectively grown on both sides of the ridge by MOCVD or the like. As the result of this growth, the portion of the cladding layer 3 at the isolation part (b) between the laser part (a) and the modulator part (c) is replaced with the semi-insulating semiconductor layer 6. By replacing the portion of the cladding layer 3 with the semi-insulating semiconductor laser 6, the isolation resistance between the laser part (a) and the modulator part (c) can be further improved, as compared with the case of the semiconductor laser device according to the first embodiment.

Then, in order to make the capacitance of the semiconductor laser device lower, portions of the semi-insulating semiconductor laser 6 on both sides of the active layer 2 are etched to process the wafer into a ridge structure having a width of 5~20 μm. The entire surface of the wafer is covered with the insulating film 7 for protection, and the insulating film 5 on the contact layer 4 is removed, completing the semiconductor laser device shown in FIG. 8(a). In addition, an electrode is formed on the portions of the contact layer 4 not masked by the insulating film 7.

As described above, in the semiconductor laser device according to the second embodiment of the invention, since the contact layer 4 with a stripe structure having a width of 1~2 μm is used in making an ohmic contact with the electrode material, the p type cladding layer 3 below the contact layer 4 is narrowed to 1~2 μm as well, and the width of the isolation part between the laser part and modulator part is also made 1~2 μm with good controllability, without narrowing the isolation part by etching or the like. Thereby, the flow of current between the contact layer 4 of the laser part (a) and the contact layer 4 of the modulator part (c) is reduced. As a result, the isolation resistance between the laser part (a) and the modulator part (c) can be improved by one order of magnitude, as compared with the case where the contact layer 4 having a width of 10~20 μm is used as in the prior art semiconductor laser device shown in FIG. 24(a). In addition, because the portion of the cladding layer 3 between the laser part (a) and the modulator part (c) is removed and the Fe-doped InP semi-insulating semiconductor layer 6 is grown in that region where the portion of the cladding layer 3 is removed, the resistance of the isolation part (b) between the laser part (a) and the modulator part (c) is increased. Consequently, by replacing the portion of the cladding layer 3 with the semi-insulating semiconductor laser 6, the isolation resistance between the laser part (a) and the modulator part (c) can be further improved, as compared with the case of the semiconductor laser device according to the first embodiment.

[Embodiment 3]

Figure 12:
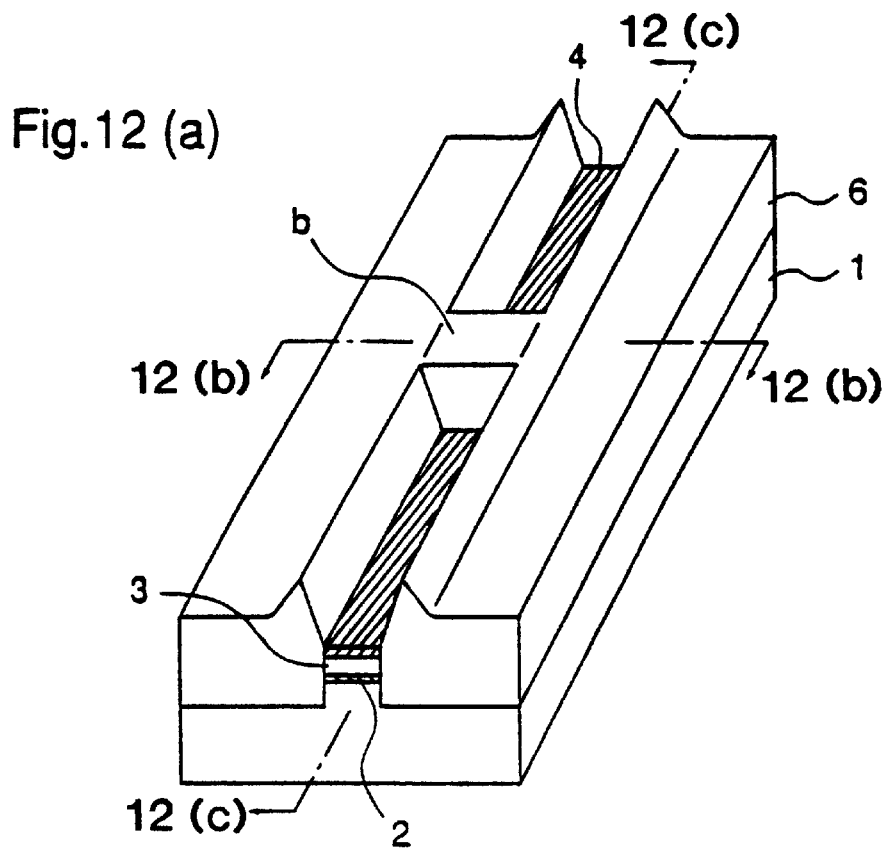
Figure 12:
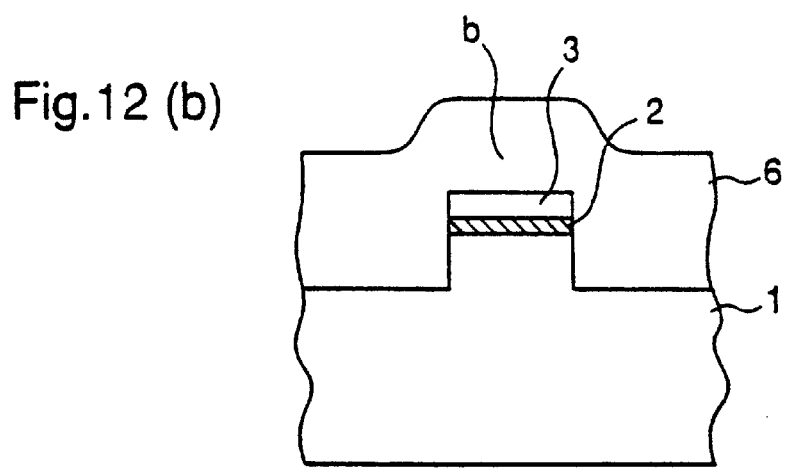
Figure 12:
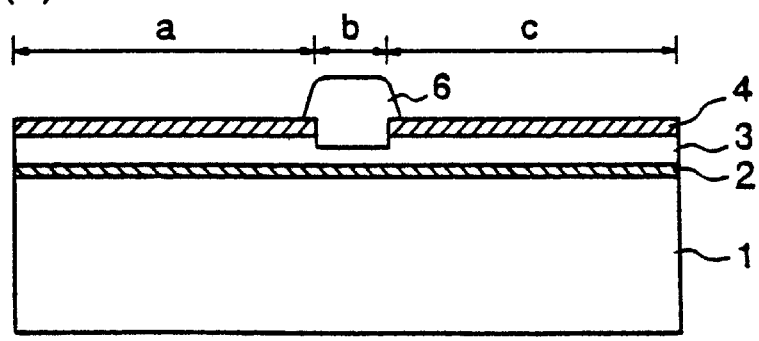
Figure 13:
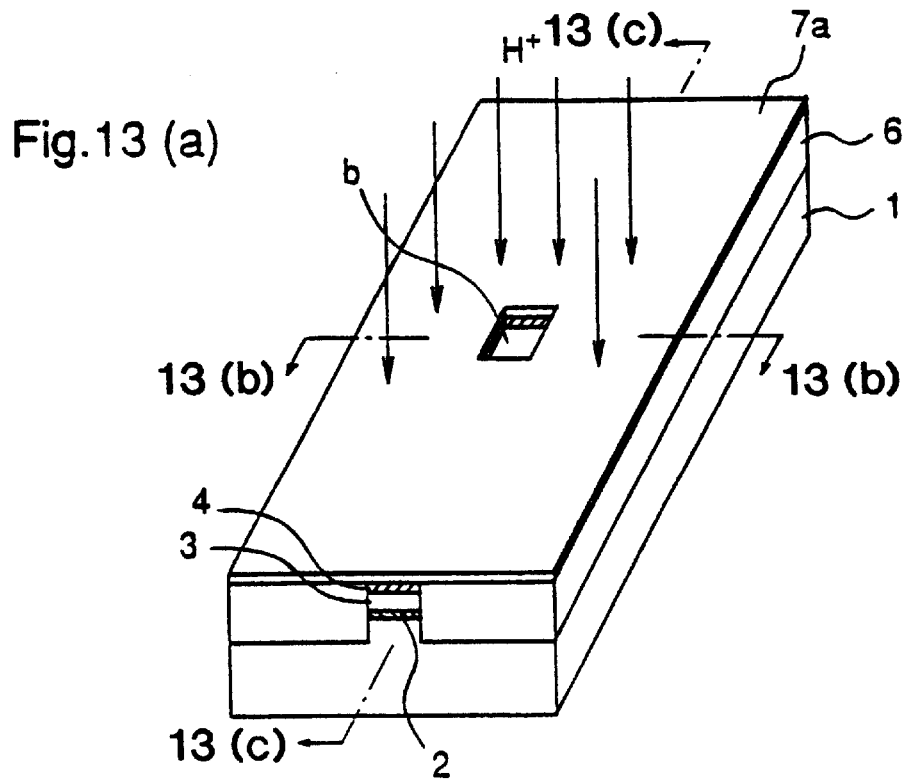
Figure 13:
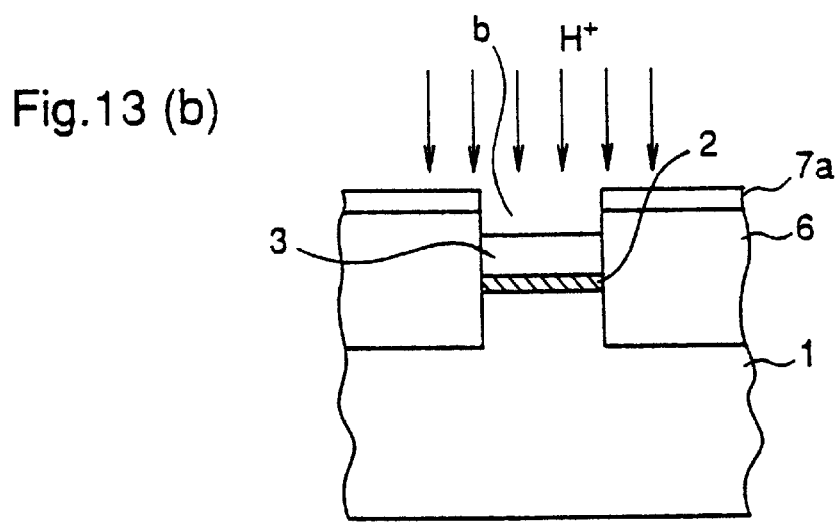
Figure 13:
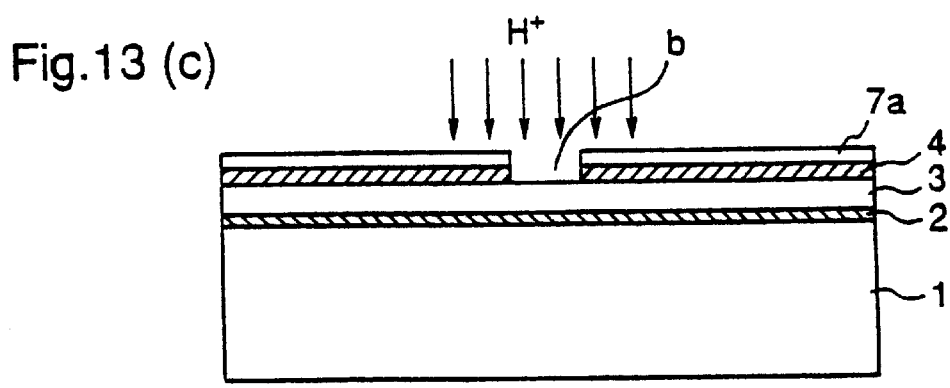
Figure 14:
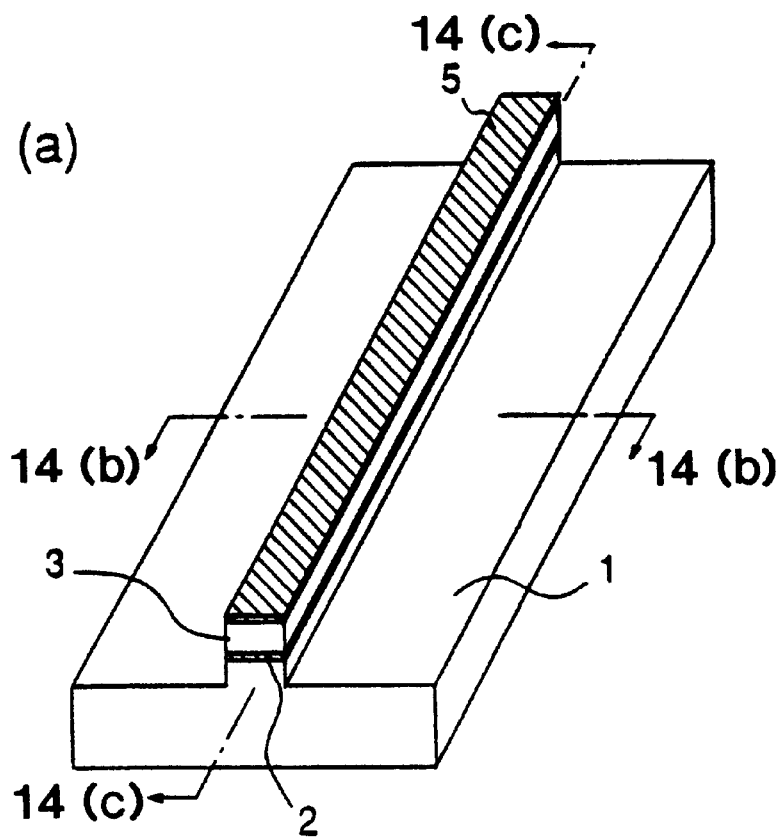
Figure 14:
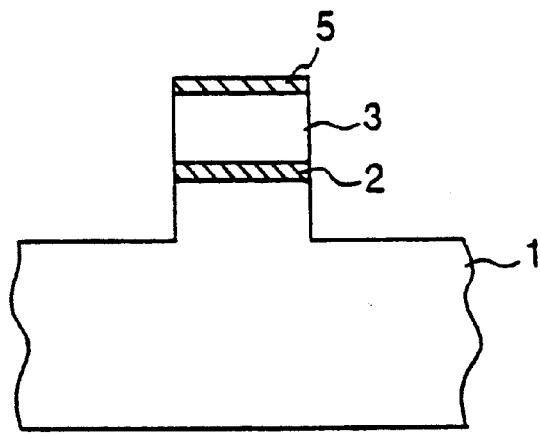
Figure 14:
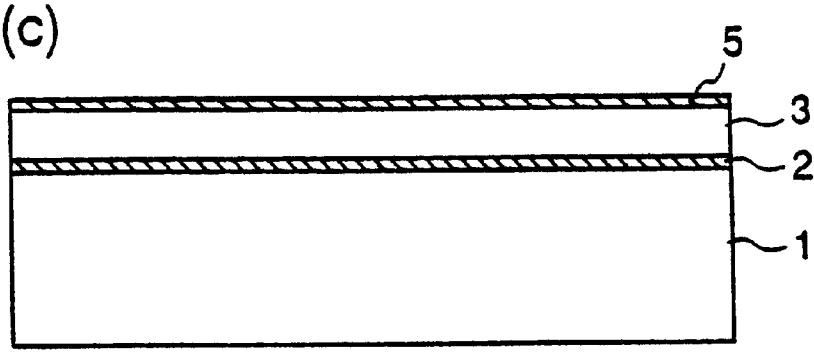

FIGS. 12(a)–12(c) are diagrams illustrating an integrated modulator and semiconductor laser device according to a third embodiment of the present invention. FIG. 12(a) is a perspective view of the semiconductor laser device, FIG. 12(b) shows a cross-section of the device taken along a line 12b—12b at an isolation part between a laser and a modulator, and FIG. 12(c) shows a cross-section of the device taken along a line 12c—12c in the resonator length direction. In these figures, the same reference numerals as those shown in FIGS. 4(a)–4(c) designate the same or corresponding parts.

A description is given of the structure of the semiconductor laser device.

In this semiconductor laser device, a ridge, i.e., optical waveguide, comprising an active layer 2 and a p type InP cladding layer 3 is disposed on an n type InP semiconductor substrate 1. This ridge provides a semiconductor laser part (a) and a modulator part (c) having a diffraction grating (not shown) at the surface of the semiconductor substrate 1 beneath the active layer 2. Burying layers comprising an Fe-doped InP semi-insulating semiconductor layer 6 are disposed on both sides of the ridge. This semi-insulating semiconductor layer 6 is different from those in the first and second embodiments. That is, the semi-insulating semiconductor layer 6 is formed higher than the ridge, the layer not being formed by selective growth. A portion of the cladding layer 3 is absent between the laser part (a) and the modulator part (c) and the Fe-doped InP semi-insulating semiconductor layer 6 fills in that region where the portion of the cladding layer 3 is absent. A p type InGaAs contact layer 4 having a width equivalent to the width of the active layer 2 is disposed on the ridge. The contact layer 4 is absent at an isolation part (b) between the laser part (a) and the modulator part (c). In addition, the contact layer 4 makes an ohmic contact with an electrode material which is not shown here.

In this semiconductor laser device, as in the semiconductor laser device of the first embodiment, the light emitted from the laser part (a) which is operated with direct current, can be modulated by changing the bias voltage which is applied to the modulator part (c).

A description is given of the fabricating method.

FIGS. 9(a)–9(c), 10(a)–10(c) and 11(a)–11(c) are diagrams illustrating respective process steps in the fabricating method.

Initially, after forming a diffraction grating in a region of the n type InP semiconductor substrate 1 where the modulator is to be formed (not shown), the active layer 2, the p type InP cladding layer 3 and the low-resistance p type InGaAs contact layer 4 are successively grown on the substrate 1 by MOCVD or the like. Then, a stripe of an insulating film 5 having a width of 1~2 μm is formed on the contact layer 4. Using this insulating film 5 as a mask, dry etching is performed to form a ridge serving as an optical waveguide and having a height of about 2~3 μm (FIGS. 9(a)–9(c)).

Figure 10:
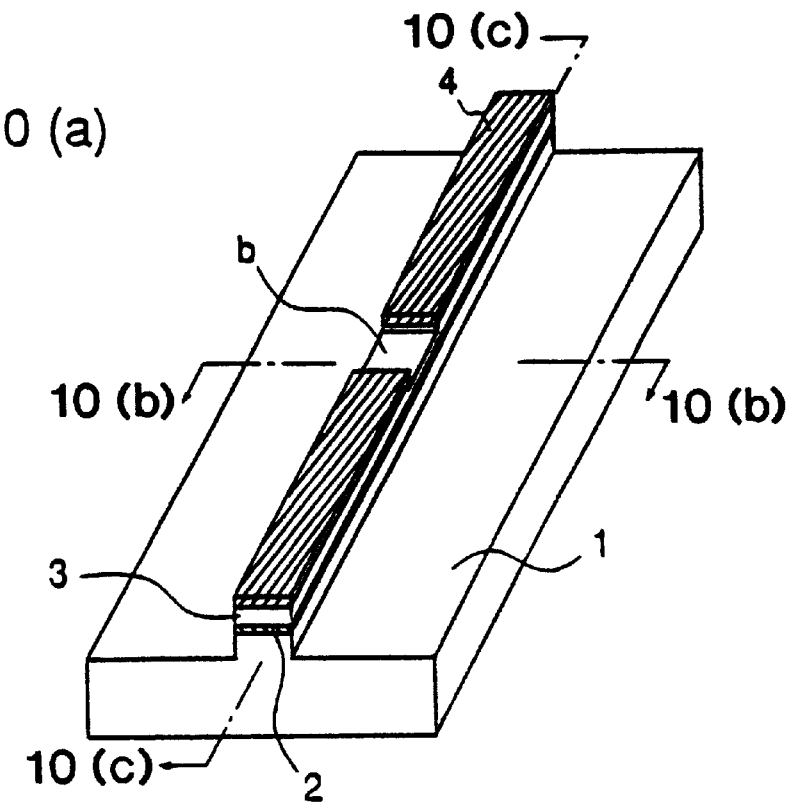
Figure 10:
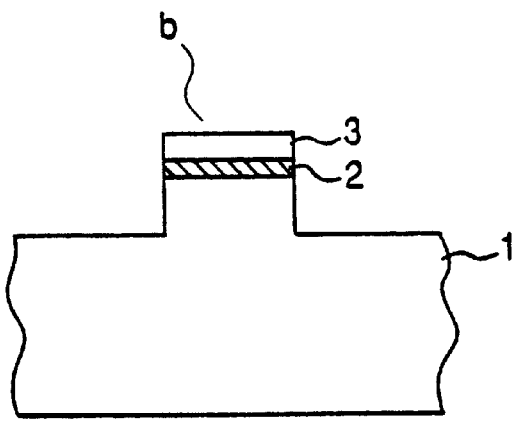
Figure 10:
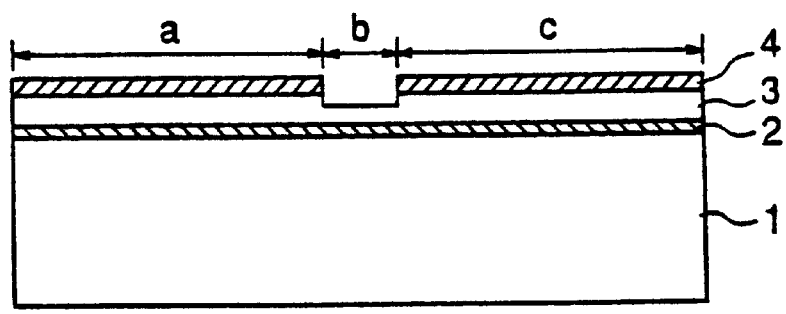

Thereafter, as shown in FIGS. 10(a)–10(c), the insulating film 5, the contact layer 4 and a portion of the cladding layer 3 at the isolation part (b) between the laser part (a) and the modulator part (c) are etched and removed. This etching is not performed to the active layer 2. Thereby, the optical coupling efficiency between the laser part (a) and the modulator part (c) can be maintained to be almost 100%.

Figure 11:
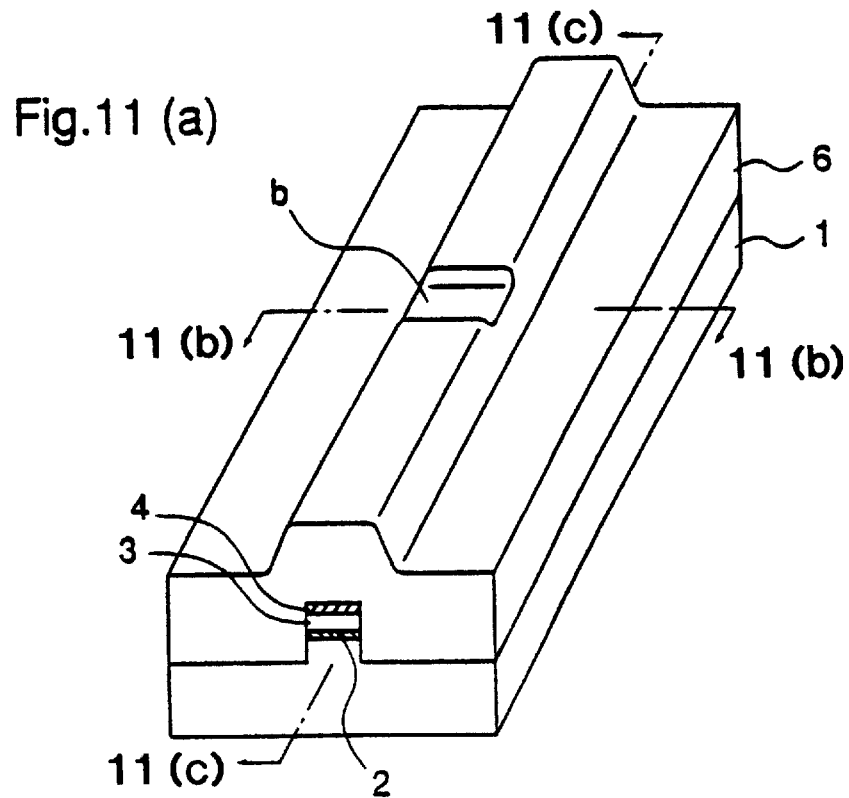
Figure 11:
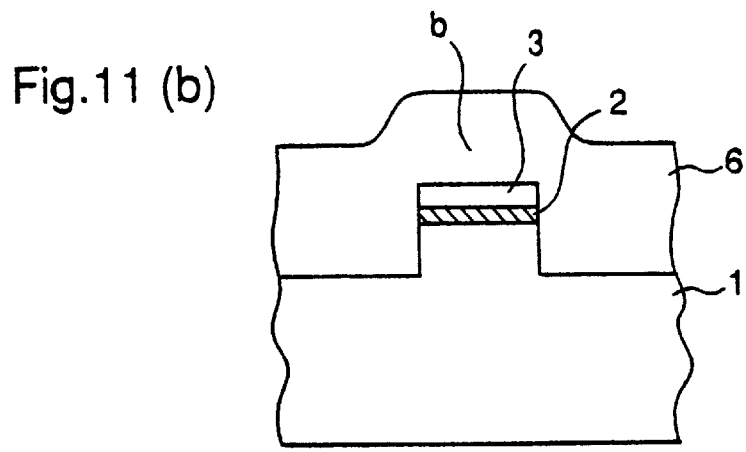
Figure 11:
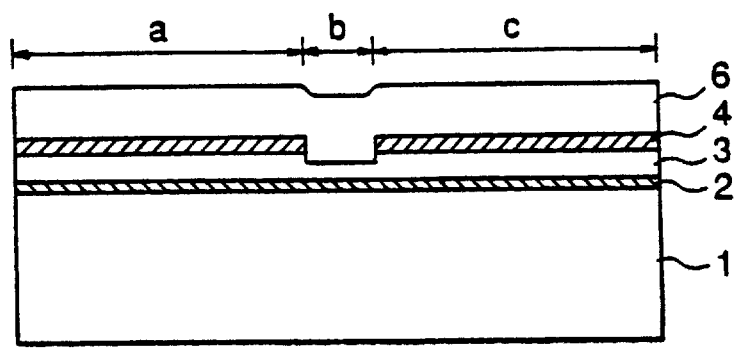

In the step of FIGS. 11(a)–11(c), without performing the selective growth as in the first and second embodiments, the Fe-doped InP semi-insulating semiconductor layer 6 is grown on the entire surface by MOCVD or the like. As the result of this growth, the portion of the cladding layer 3 at the isolation part (b) between the laser part (a) and the modulator part (c) is replaced with the semi-insulating semiconductor layer 6. By replacing the portion of the cladding layer 3 with the semi-insulating semiconductor laser 6, the isolation resistance between the laser part (a) and the modulator part (c) can be further improved, as compared with the case of the semiconductor laser device according to the first embodiment.

Then, portions of the semi-insulating semiconductor laser 6 on the contact layer 4 are etched and removed to expose the contact layer 4, completing the semiconductor laser device shown in FIG. 12(a). In addition, the contact layer 4 exposed makes an ohmic contact with the electrode material.

As described above, in the semiconductor laser device according to the third embodiment of the invention, since the contact layer 4 with a stripe structure having a width of 1~2 μm is used in making an ohmic contact with the electrode material, the p type cladding layer 3 below the contact layer 4 is narrowed to 1~2 μm as well, and the width of the isolation part between the laser part and the modulator part is also made 1~2 μm with good controllability, without narrowing the isolation part by etching or the like. Thereby, the flow of current between the contact layer 4 of the laser part (a) and the contact layer 4 of the modulator part (c) is reduced. As a result, the isolation resistance between the laser part (a) and the modulator part (c) can be improved by one order of magnitude, as compared with the case where the contact layer 4 having a width of 10~20 μm is used as in the prior art semiconductor laser device shown in FIG. 24(a). In addition, because the portion of the cladding layer 3 between the laser part (a) and the modulator part (c) is removed and the Fe-doped InP semi-insulating semiconductor layer 6 is grown in that region where the portion of the cladding layer 3 is removed, the resistance of the isolation part (b) between the laser part (a) and the modulator part (c) is increased. Consequently, by replacing the portion of the cladding layer 3 with the semi-insulating semiconductor laser 6, the isolation resistance between the laser part (a) and the modulator part (c) can be further improved, as compared with the case of the semiconductor laser device according to the first embodiment. Furthermore, when the semi-insulating semiconductor layer 6 is grown on both sides of the ridge, the selective growth as in the first and second embodiments is not performed. Accordingly, the semiconductor laser device according to the third embodiment can be fabricated more easily than the devices of the first and second embodiments.

[Embodiment 4]

A semiconductor laser device according to a fourth embodiment of the present invention is fundamentally identical to the semiconductor laser device according to the first embodiment, except that protons (H+) are implanted into the cladding layer 3 between the laser part (a) and the modulator part (c) to make the resistance of the cladding layer 3 between the laser part (a) and the modulator part (c) high.

More specifically, for fabricating this semiconductor laser device, after growing the semi-insulating semiconductor laser 6 as shown in FIG. 3(a) in the process steps for fabricating the semiconductor laser device according to the first embodiment, an insulating film 7a having an opening at the isolation part (b) is formed, and then protons are implanted from the upper surface thereof.

As described above, in the semiconductor laser device according to the fourth embodiment of the invention, since the protons are implanted into the cladding layer 3 between the laser part (a) and the modulator part (c) to make the resistance of the cladding layer 3 between the laser part (a) and the modulator part (c) high, the resistance of the cladding layer 3 at the isolation part (b) between the laser part (a) and the modulator part (c) is increased. Consequently, the isolation resistance between the laser part (a) and the modulator part (c) can be further improved, as compared with the case of the semiconductor laser device according to the first embodiment.

[Embodiment 5]

Figure 19:
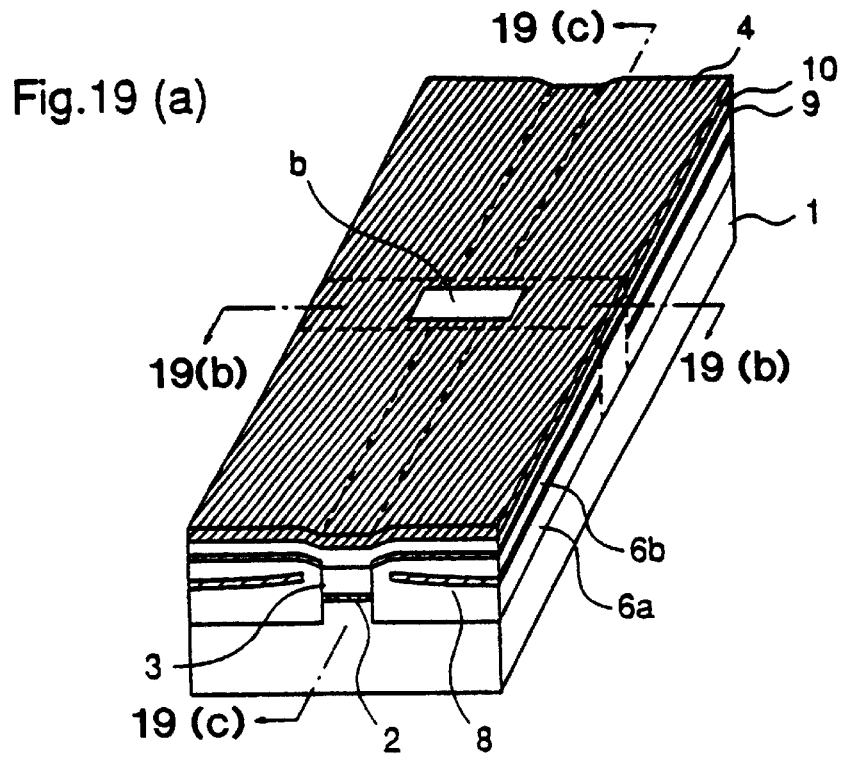
Figure 19:
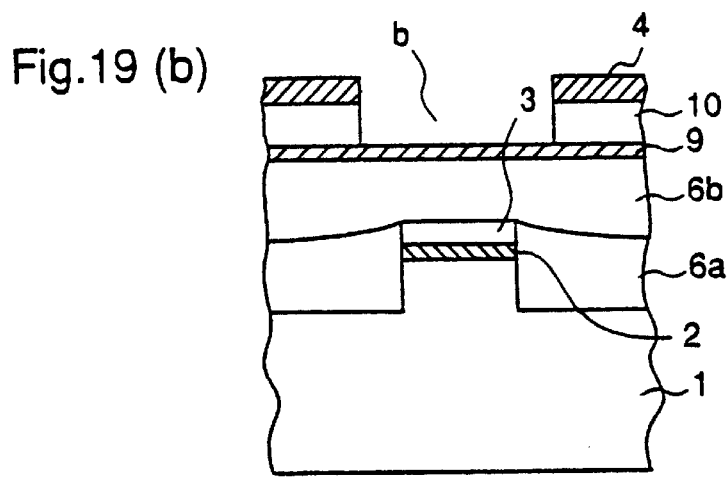
Figure 19:
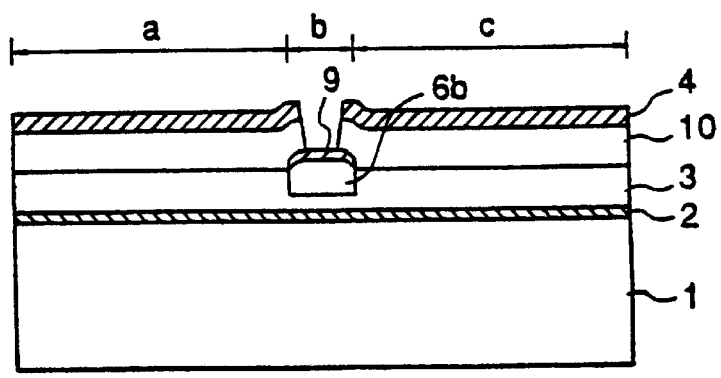

FIGS. 19(a)–19(c) are diagrams illustrating an external modulator integrated semiconductor laser device according to a fifth embodiment of the present invention. FIG. 19(a) is a perspective view of the semiconductor laser device, FIG. 19(b) shows a cross-section of the device taken along a line 19b—19b at an isolation part between a laser and a modulator, and FIG. 19(c) shows a cross-section of the device taken along a line 19c—19c in the resonator length direction. In these figures, the same reference numerals as those shown in FIGS. 4(a)–4(c) designate the same or corresponding parts.

A description is given of the structure of the semiconductor laser device.

Figure 18:
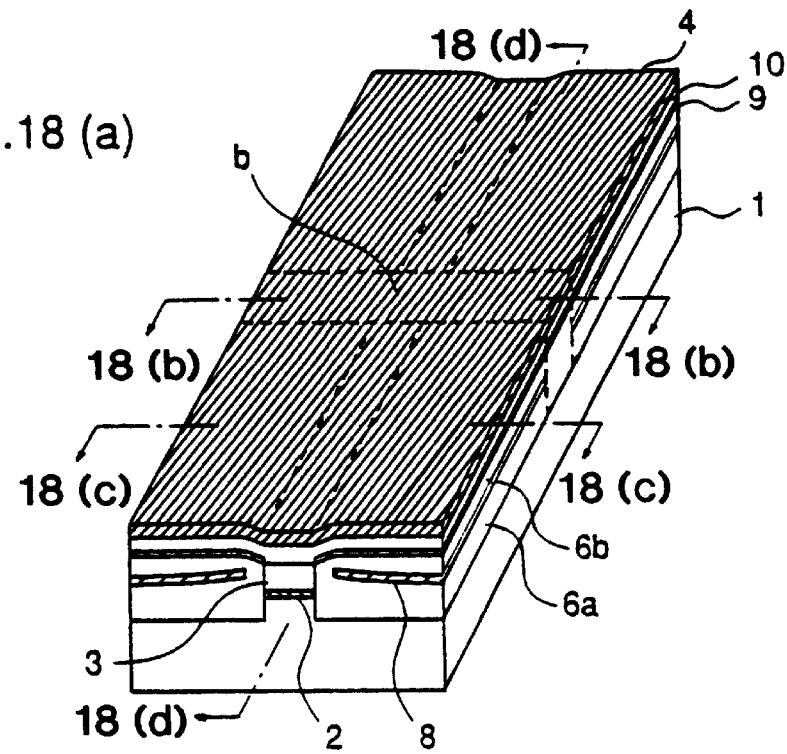
Figure 18:
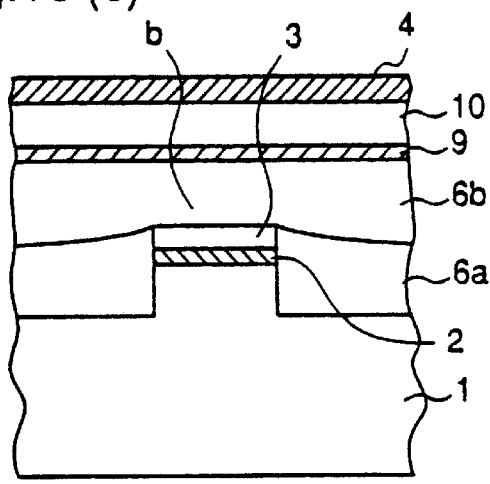
Figure 18:
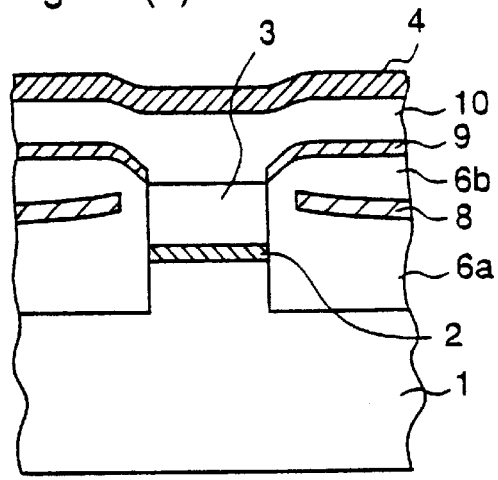
Figure 18:
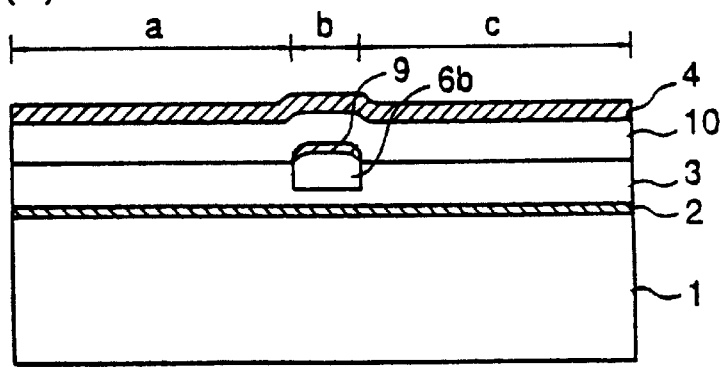

In this semiconductor laser device, a ridge, i.e., optical waveguide, comprising an active layer 2 and a p type InInP cladding layer 3 is disposed on an n type InP semiconductor substrate 1. This ridge provides a semiconductor laser part (a) and a modulator part (c) having a diffraction grating (not shown) at the surface of the semiconductor substrate 1 beneath the active layer 2. Burying layers comprising an Fe-doped InP semi-insulating semiconductor layer 6a, an n type InP hole trap layer 8 and an Fe-doped InP semi-insulating semiconductor layer 6b, successively formed, are disposed on both sides of the ridge as shown in FIG. 18(c). In order to improve the isolation resistance between the laser and the modulator, the hole trap layer 8 is absent between the laser part (a) and the modulator part (c) as shown in FIG. 18(b). An InGaAsP etch stopping layer 9 having a composition producing an energy band gap corresponding to a 1.05~1.15 μm wavelength, a p type InP cladding layer 10 and a p type InGaAs contact layer 4 are successively disposed on the ridge and on the burying layers. The contact layer 4 and the cladding layer 10 are absent at an isolation part (b) between the laser part (a) and the modulator part (c). A portion of the cladding layer 3 is absent between the laser part (a) and the modulator part (c) and the Fe-doped InP semi-insulating semiconductor layer 6b fills in that region where the portion of the cladding layer 3 is absent.

In this semiconductor laser device, as in the semiconductor laser device of the first embodiment, the light emitted from the laser part (a) which is operated with direct current, can be modulated by changing the bias voltage which is applied to the modulator part (c).

A description is given of the fabricating method.

FIGS. 14(a)–14(c), 15(a)–15(c), 16(a)–16(c), 17(a)–17(d) and 18(a)–18(d) are diagrams illustrating respective states of process steps in the fabricating method.

Initially, after forming a diffraction grating in a region of the n type InP semiconductor substrate 1 where the modulator is to be formed (not shown), the active layer 2 and the p type InP cladding layer 3 are successively grown on the substrate 1 by MOCVD or the like. Then, a stripe of an insulating film 5 having a width of 1~2 μm is formed on the cladding layer 3. Using this insulating film 5 as a mask, dry etching is performed to form a ridge serving as an optical waveguide and having a height of about 2~3 μm (FIGS. 14(a)–14(c)).

Figure 15:
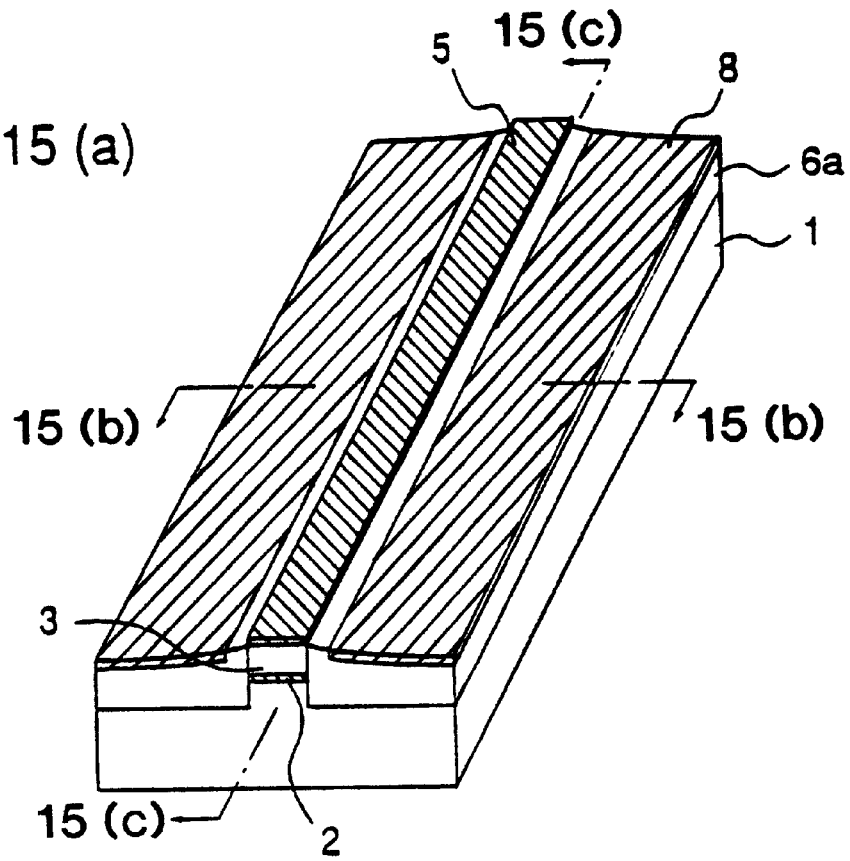
Figure 15:
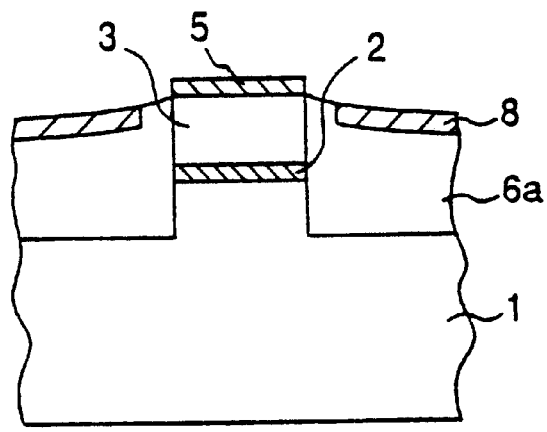
Figure 15:
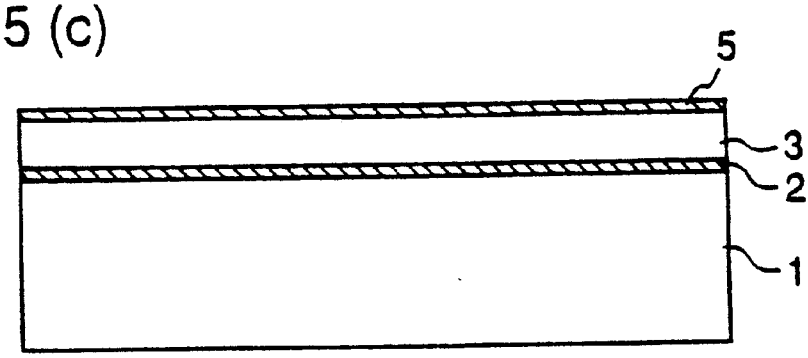

Thereafter, as shown in FIGS. 15(a)–15(c), using the insulating film 5 as a mask, the Fe-doped InP semi-insulating semiconductor layer 6a and the n type InP hole trap layer 8 are selectively grown on both sides of the ridge by MOCVD or the like.

Figure 16:
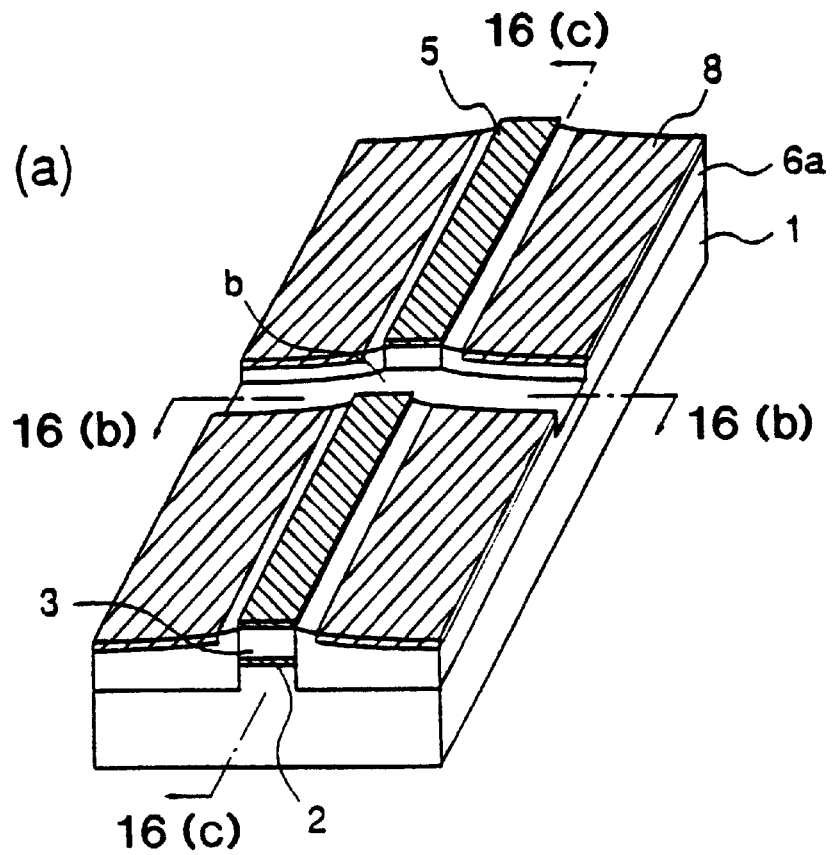
Figure 16:
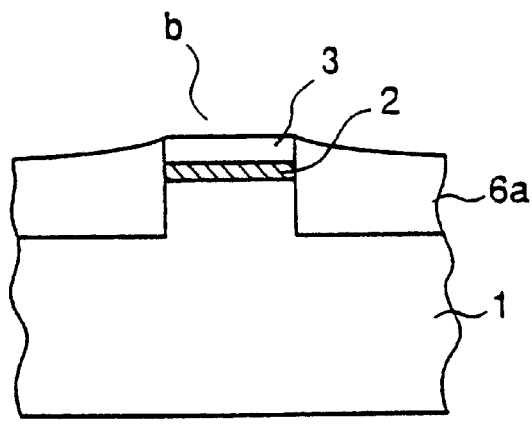
Figure 16:
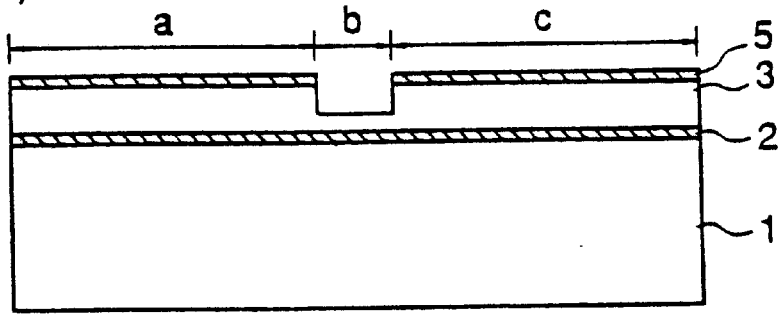
Figure 17:
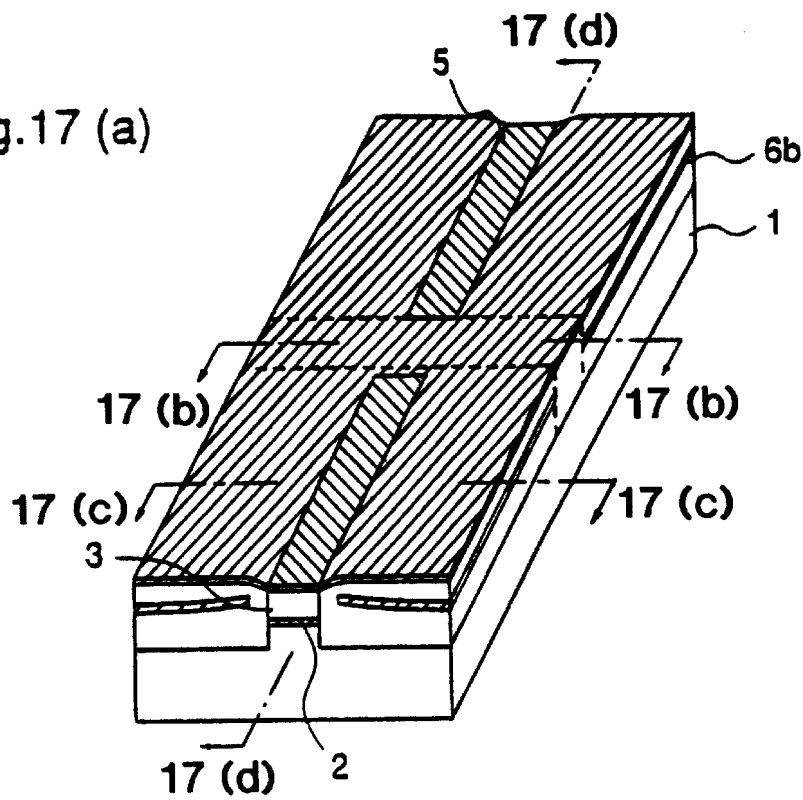
Figure 17:
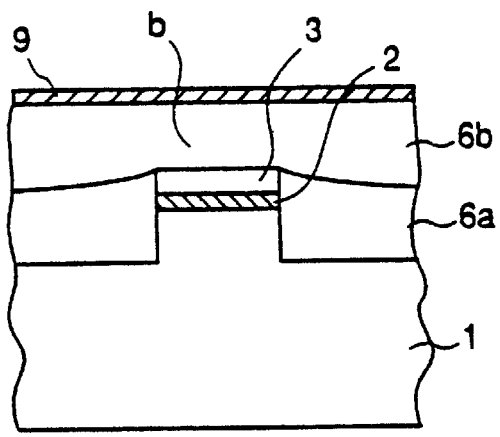
Figure 17:
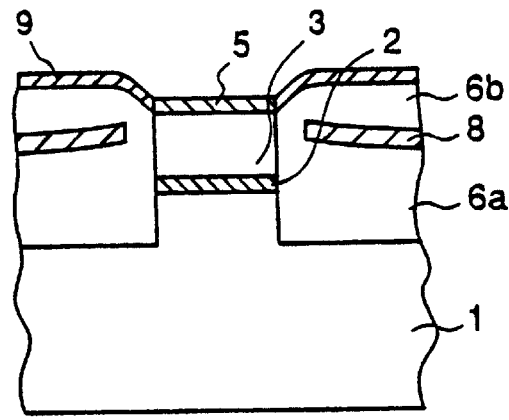
Figure 17:
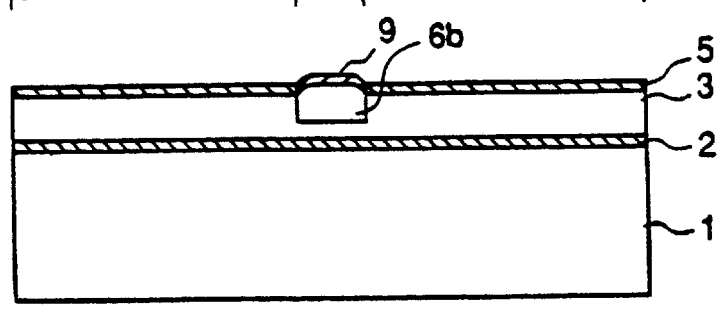

As shown in FIGS. 16(a)–16(c), in the isolation part (b) between the laser part (a) and the modulator part (c), the insulating film 5 and a portion of the cladding layer 3 at the ridge waveguide are etched and removed, and the hole trap layer 8 and a portion of the semi-insulating semiconductor layer 6a at both sides of the ridge waveguide are etched and removed. In this etching, the etching width transterse to the resonator length direction is equal to the chip width, i.e., about 200~300 μm, the etching width parallel to the resonator length direction is about 10~50 μm, and the etching depth is a depth that enables the hole trap layer 8 to be completely removed, i.e., about 1~2 μm.

Then, as shown in FIGS. 17(a)–17(d), the semi-insulating semiconductor layer 6b and the p type InGaAsP etch stopping layer 9 having a composition producing an energy band gap corresponding to a 1.05~1.15 μm wavelength are successively grown by MOCVD or the like, thereby flattening the isolation part (b) where the etching is performed.

In the step of FIGS. 18(a)–18(d), after removal of the insulating film 5, the p type InP cladding layer 10 and the p type InGaAsP contact layer 4 are successively grown on the entire surface by MOCVD or the like.

Then, the contact layer 4 and the cladding layer 10 at the isolation part (b) are etched and removed until the etching reaches the etch stopping layer 9, completing the semiconductor laser device shown in FIG. 19(a). For the etching, selective etching is employed, a hydrochloric acid based etchant is used for etching the cladding layer 10 comprising InP, and the etching is stopped at the etch stopping layer 9 comprising InGaAsP. This etching is not performed to the active layer 2. Thereby, the optical coupling efficiency between the laser part (a) and the modulator part (c) can be maintained to be almost 100%.

As described above, in the semiconductor laser device according to the fifth embodiment of the invention, since the portion of the cladding layer 3 between the laser part (a) and the modulator part (c) is removed and the Fe-doped InP semi-insulating semiconductor layer 6b is grown in that region where the portion of the cladding layer 3 is removed, the resistance value of the isolation part (b) between the laser part (a) and the modulator part (c) is increased, whereby the isolation resistance between the laser part (a) and the modulator part (c) can be improved. By removing the n type InP hole trap layer 8 at the isolation part (b), the flow of current through the hole trap layer 8 is prevented. As a result, the isolation resistance between the laser part (a) and the modulator part (c) can be further improved. Further, even when the etching at the isolation part (b) is performed to the vicinity of the active layer 2 as shown in FIGS. 16(a)–16(c), the semi-insulating semiconductor layer 6b is grown in the isolation part (b) as shown in FIGS. 17(a)–17(d). Therefore, the light does not escape from the device and cause loss of light. Furthermore, by growing the semi-insulating semiconductor layer 6b in the isolation part (b) with a planar surface, the fabricating processes after this growth, especially a photolithographic process, can be facilitated. In addition, because no etching is performed to the active layer 2, the optical coupling efficiency between the laser part (a) and the modulator part (c) can be maintained to be almost 100%.

[Embodiment 6]

Figure 20:
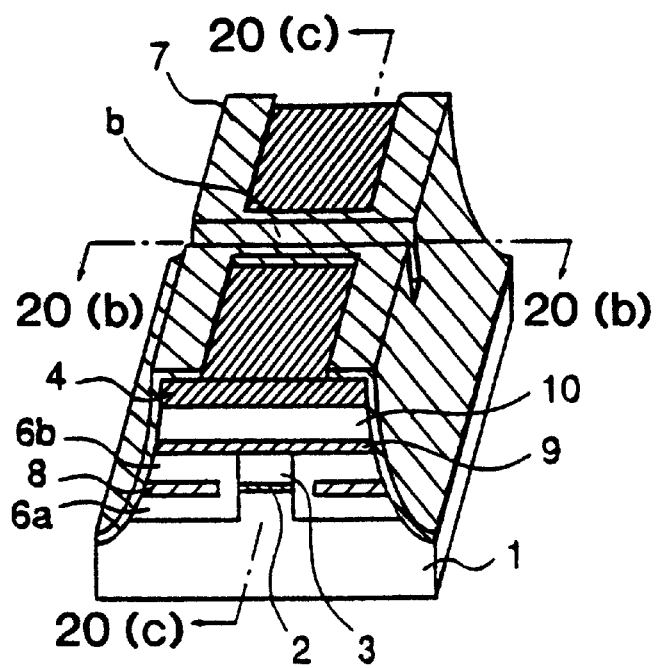
Figure 20:
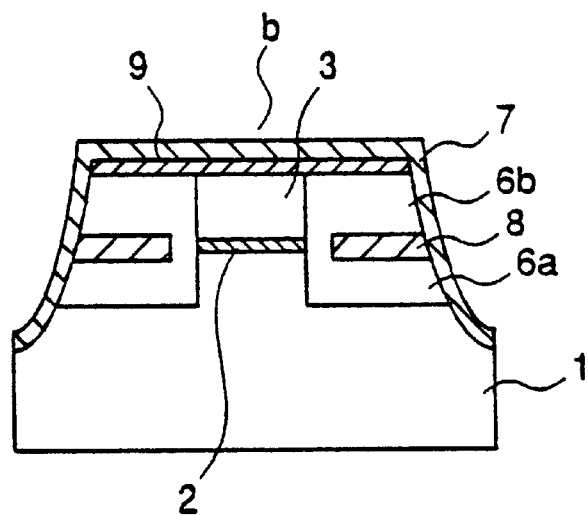
Figure 20:
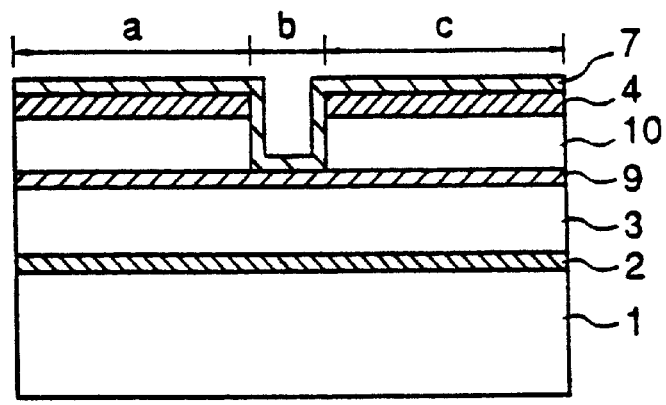
Figure 21:
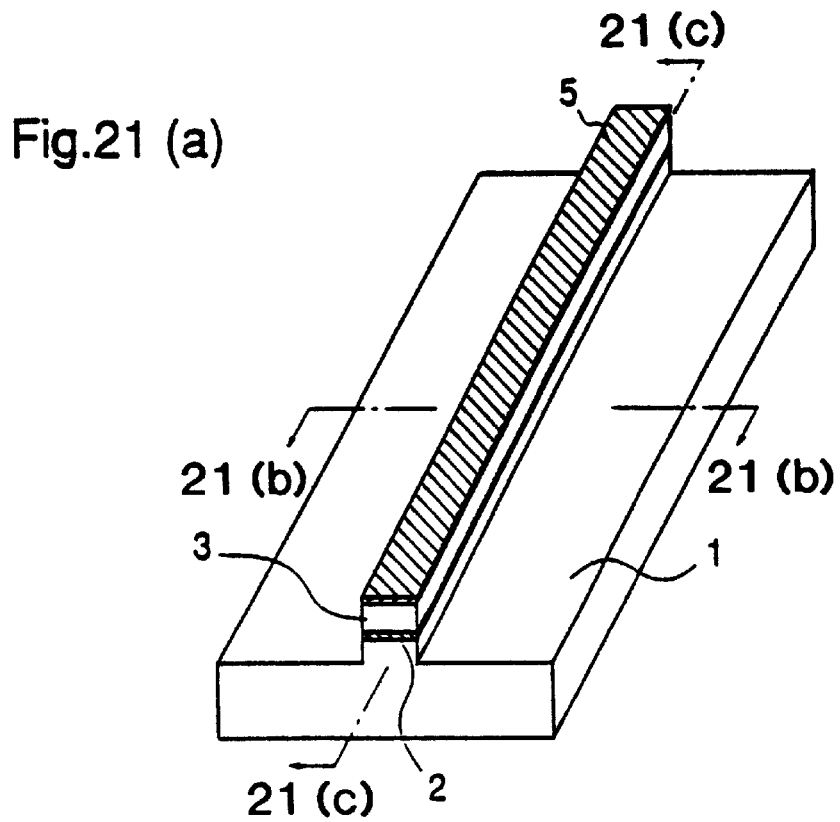
Figure 21:
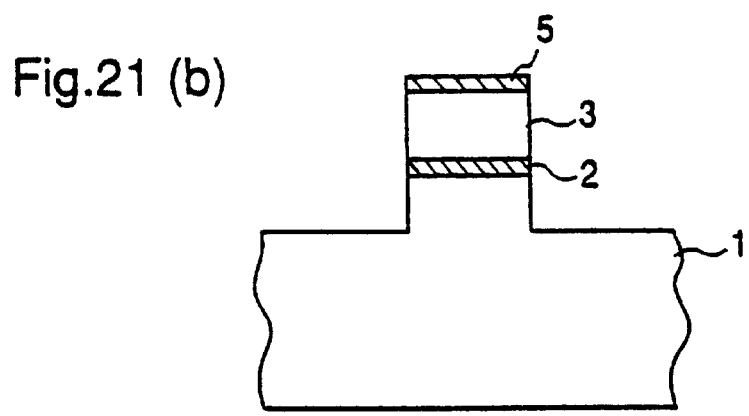
Figure 21:
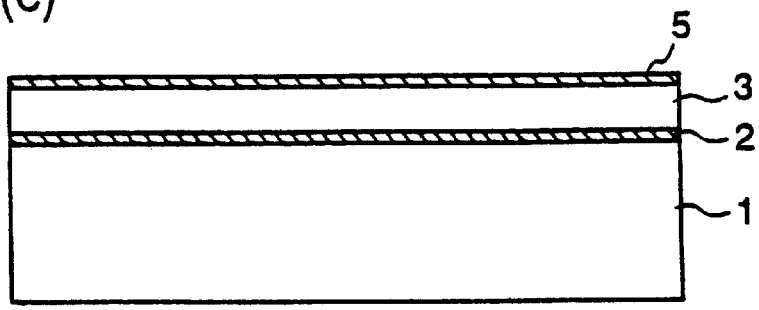
Figure 22:
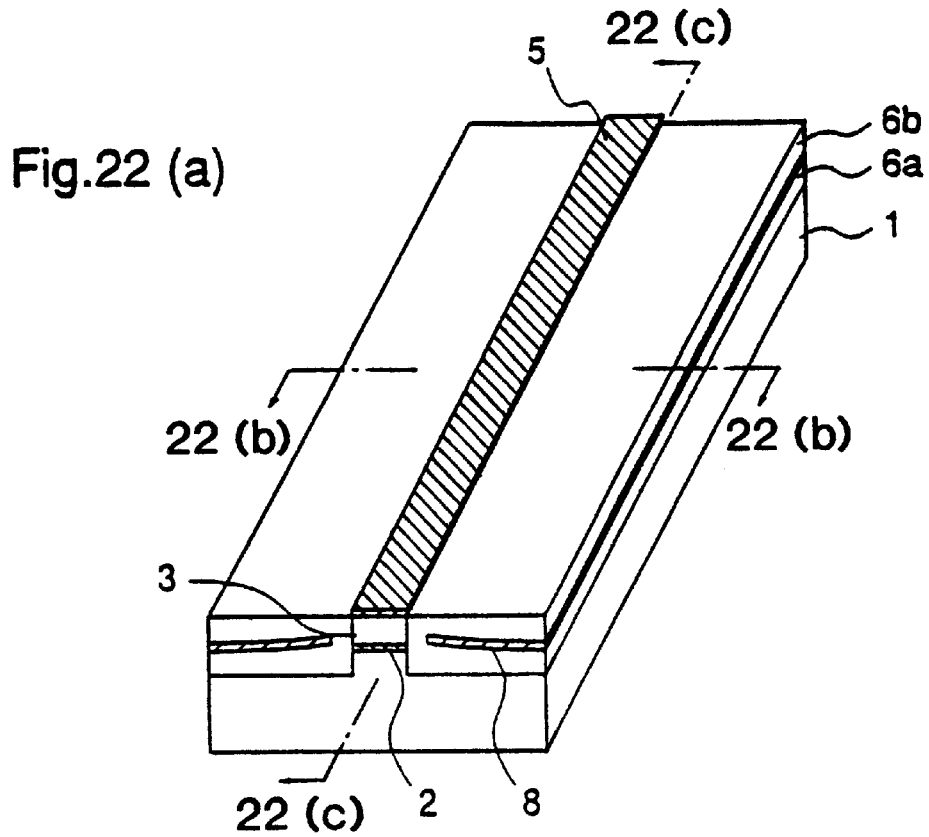
Figure 22:
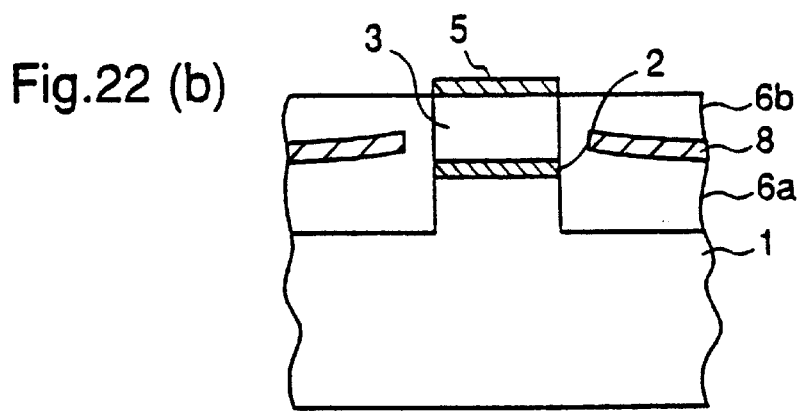
Figure 22:
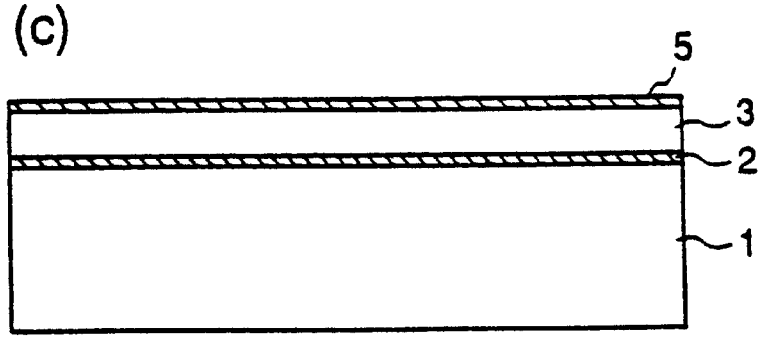
Figure 23:
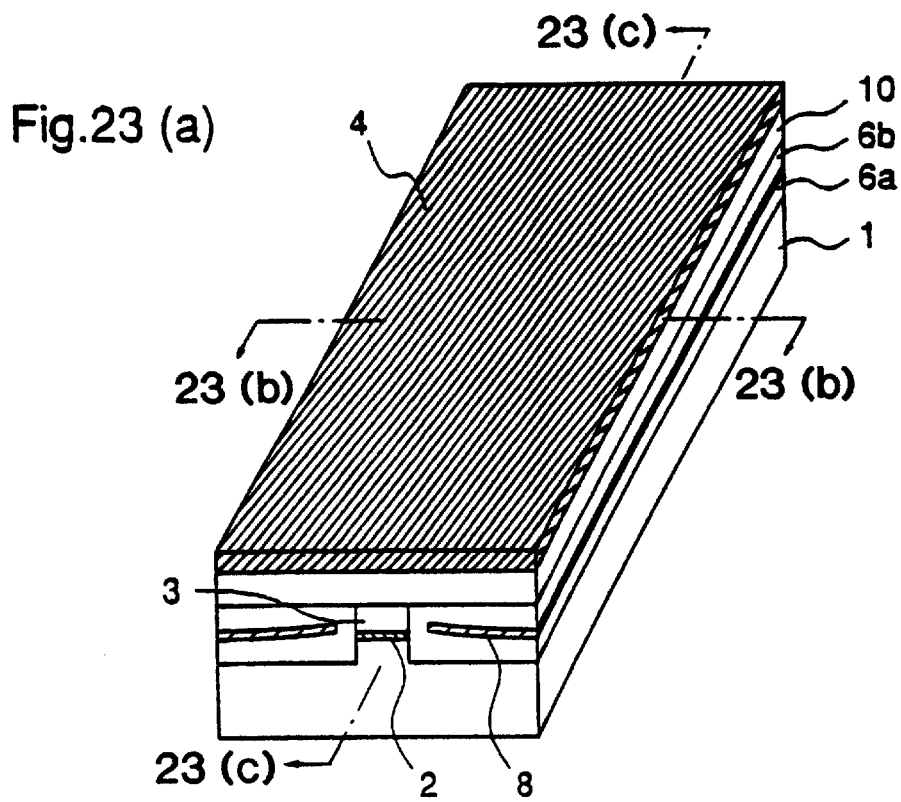
Figure 23:
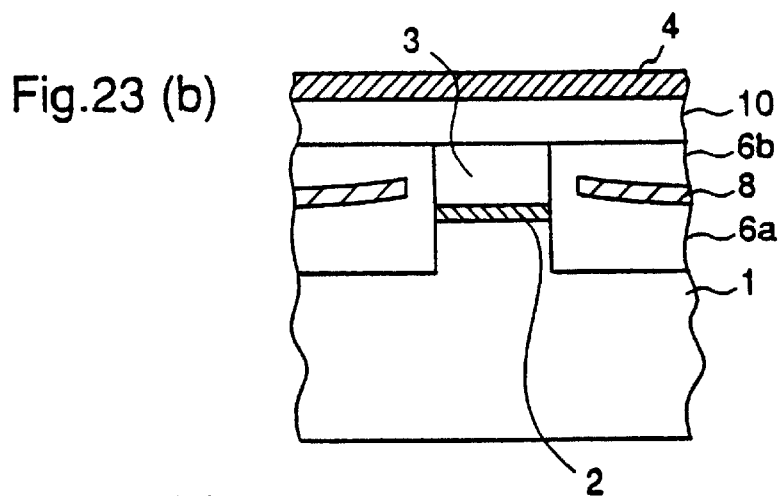
Figure 23:
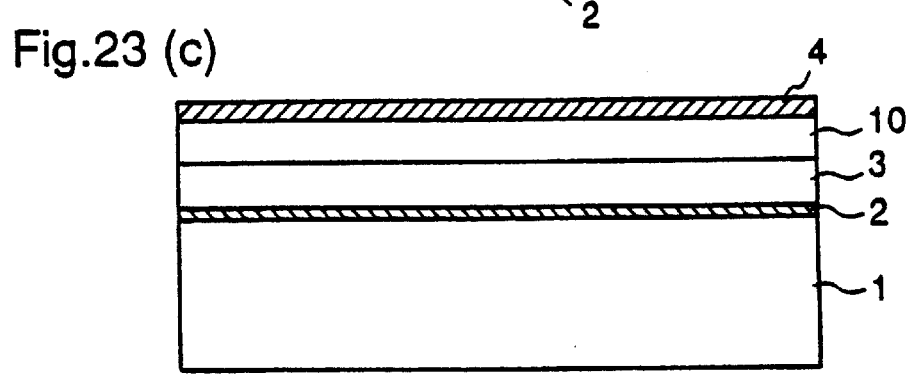

FIGS. 20(a)–20(c) are diagrams illustrating an integrated modulator and semiconductor laser device according to a sixth embodiment of the present invention. FIG. 20(a) is a perspective view of the semiconductor laser device, FIG. 20(b) shows a cross-section of the device taken along a line 20b—20b at an isolation part between a laser and a modulator, and FIG. 20(c) shows a cross-section of the device taken along a line 20c—20c in the resonator length direction. In these figures, the same reference numerals as those shown in FIGS. 4(a)–4(c) and 19(a)–19(c) designate the same or corresponding parts.

A description is given of the structure of the semiconductor laser device.

In this semiconductor laser device, a ridge, i.e., optical waveguide, comprising an active layer 2 and a p type InP cladding layer 3 is disposed on an n type InP semiconductor substrate 1. This ridge provides a semiconductor laser part (a) and a modulator part (c) having a diffraction grating (not shown) at the surface of the semiconductor substrate 1 beneath the active layer 2. Burying layers comprising an Fe-doped InP semi-insulating semiconductor layer 6a, an n type InP hole trap layer 8 and an Fe-doped InP semi-insulating semiconductor layer 6b, successively formed, are disposed on both sides of the ridge. A p type InGaAsP etch stopping layer 9, a p type InP cladding layer 10 and a p type InGaAs contact layer 4 are successively disposed on the ridge and on the burying layers. The contact layer 4 and the cladding layer 10 are absent at an isolation part (b) between the laser part (a) and the modulator part (c). The entire surface, except for portions of the contact layer 4, is covered with an insulating film 7.

In this semiconductor laser device, as in the semiconductor laser device of the first embodiment, the light emitted from the laser part (a), which is operated with direct current, can be modulated by changing the bias voltage which is applied to the modulator part (c).

A description is given of the fabricating method.

Figure 24:
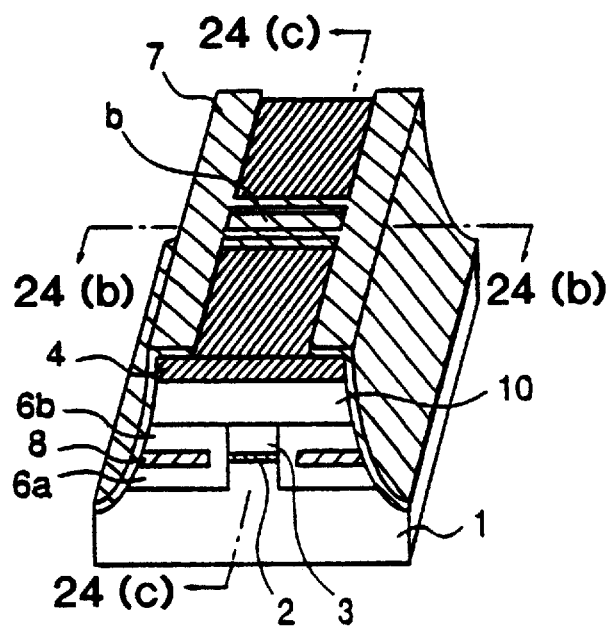
Figure 24:
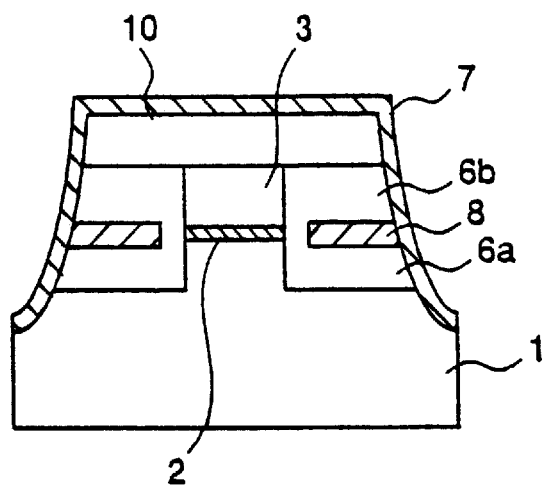
Figure 24:
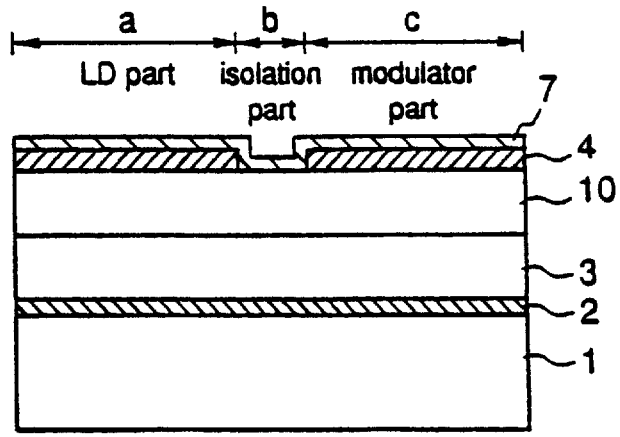
Figure 25:
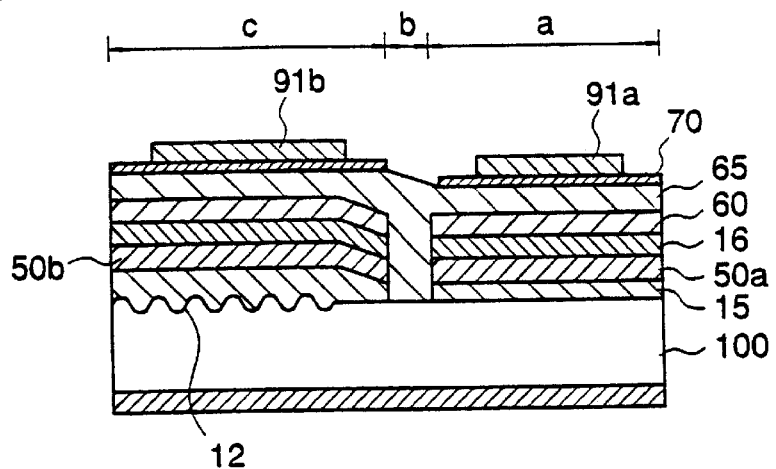
FIG. 25 is a cross-sectional view illustrating another prior art semiconductor laser device.
Figure 26:
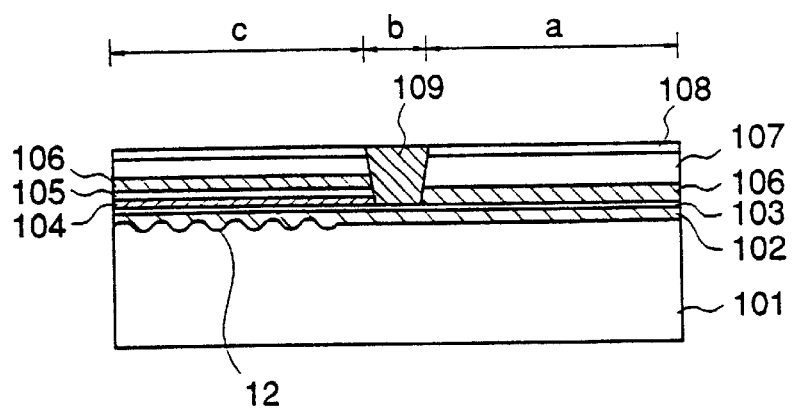
FIG. 26 is a cross-sectional view illustrating still another prior art semiconductor laser device.
Figure 27:
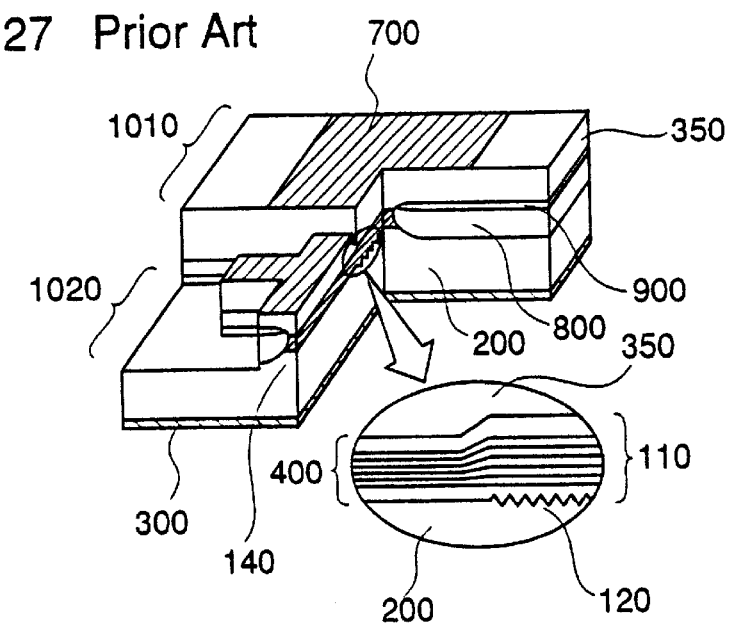
FIG. 27 is a perspective view illustrating still another prior art semiconductor laser device a portion of which is sectioned.

The semiconductor laser device according to the sixth embodiment is fabricated in the same way as some processes for fabricating the prior art semiconductor laser device shown in FIG. 24(a), that is, the fabricating processes shown in FIGS. 21(a)–21(c) and 22(a)–22(c). Thereafter, after removal of the insulating film 5, the p type InGaAs etch stopping layer 9 having a composition producing an energy band gap corresponding to a 1.05 $\mu$m wavelength, the p type InP cladding layer 10 and the p type InGaAs contact layer 4 are successively grown on the ridge and on the burying layers by MOCVD or the like. Utilizing the layer structure of InGaAs/InP/InGaAsP, i.e., contact layer 4/cladding layer 10/etch stopping layer 9 from above at the isolation part (b), selective etching is performed to the isolation part (b) between the laser part (a) and the modulator part (c). Thereby, the InGaAs contact layer 4 and the InP cladding layer 10 at the isolation part (b) are etched and removed and the etching is reliably stopped at the InGaAsP etch stopping layer 9. Therefore, if the cladding layer 3 is set to the minimum thickness required for the light waveguide, the etching of the InP cladding layer 10 at the isolation part (b) can be reliably performed with good controllability. The entire surface of the wafer, except for portions of the contact layer 4, is covered with the insulating film 7, completing the semiconductor laser device shown in FIG. 20(a).

As described above, the semiconductor laser device according to the sixth embodiment of the invention is different from the prior art device in that the InGaAsP etch stopping layer 9 is interposed between the InP cladding layer 3 on the active layer 2 and the InP cladding layer 10 and, in the isolation part (b) between the laser part (a) and the modulator part (c), the InP cladding layer 10 is selectively etched after etching the InGaAs contact layer 4 as the uppermost layer. Therefore, by interposing the etch stopping layer 9, the InP cladding layer 10 at the isolation part (b) is reliably etched and removed as designed, whereby the isolation resistance between the laser part (a) and the modulator part (c) can be improved. In addition, because no etching is performed to the active layer 2, the optical coupling efficiency between the laser part (a) and the modulator part (c) can be maintained to be almost 100%.

The present invention is not limited to the semiconductor laser devices according to the first to sixth embodiments of the invention. For example, the semi-insulating semiconductor layers 6, 6a and 6b used for the respective embodiments may comprise not Fe-doped InP but Ti-doped or Cr-doped InP, or undoped AlInAs.

In addition, in the second and third embodiments of the invention, the portion of the cladding layer 3 at the isolation part (b) between the laser part (a) and the modulator part (c) is etched and removed. As in the fifth and sixth embodiments of the invention, however, by inserting an etch stopping layer in the cladding layer 3, the portion of the cladding layer 3 can be etched with good controllability, whereby the isolation resistance can be further improved.

What is claimed is:

1. An integrated light modulator and semiconductor laser device including:
   a semiconductor substrate;
   an optical waveguide comprising an active layer having a width and a cladding layer, and disposed on the semiconductor substrate, the optical waveguide including, continuously and serially arranged, a laser part, an isolation part, and a modulator part modulating laser light intensity, the isolation part electrically isolating the laser part from the modulator part, wherein the cladding layer is thinner in the isolation part, between the laser part and the modulator part, than in the laser part and the modulator part;
   a semi-insulating semiconductor layer disposed on opposite sides of the optical waveguide and present in the isolation part, between the laser part and the modulator part, on the cladding layer, opposite the active layer; and
   a low-resistance contact layer making an ohmic contact with an electrode material, disposed on the optical waveguide in the laser part and in the modulator part, but not in the isolation part between the laser part and the modulator part, and having a width equivalent to the width of the active layer.

2. The semiconductor laser device of claim 1 wherein one of protons, helium, and oxygen is included in the cladding layer in the isolation part, between the laser part and the modulator part, thereby forming a high resistance region in the cladding layer in the isolation part, between the laser part and the modulator part.

3. An integrated light modulator and semiconductor laser device including:
- a semiconductor substrate;
- an optical waveguide comprising an active layer having a width and a cladding layer, and disposed on the semiconductor substrate, the optical waveguide including, continuously and serially arranged, a laser part, an isolation part, and a modulator part modulating laser light intensity, the isolation part electrically isolating the laser part from the modulator part;
- a semi-insulating semiconductor layer disposed on opposite sides of the optical waveguide; and
- a low-resistance contact layer making an ohmic contact with an electrode material, disposed on the optical waveguide in the laser part and the modulator part, but not in the isolation part between the laser part and the modulator part, the cladding layer being thinner in the isolation part, between the laser part and the modulator part, than in the laser part and the modulator part, the semi-insulating semiconductor layer being present on the cladding layer, opposite the active layer, in the isolation part.

4. An integrated light modulator and semiconductor laser device including:
- a semiconductor substrate;
- an optical waveguide comprising an active layer having a width and a cladding layer, and disposed on the semiconductor substrate, the optical waveguide including, continuously and serially arranged, a laser part, an isolation part, and a modulator part modulating laser light intensity, the isolation part electrically isolating the laser part from the modulator part;
- a semi-insulating semiconductor layer disposed on opposite sides of the optical waveguide;
- a low-resistance contact layer making an ohmic contact with an electrode material, disposed on the optical waveguide in the laser part and the modulator part, but not in the isolation part between the laser part and the modulator part; and
- an etch stopping layer on the cladding layer in the isolation part, the cladding layer being thinner in the isolation part, between the laser part and the modulator part, than in the laser part and the modulator part.

5. The semiconductor laser device of claim 4 wherein the cladding layer includes an opening in the isolation part, extending to the etch stopping layer, so that the etch stopping layeris exposed.

6. The semiconductor laser device of claim 4 wherein the semi-insulating layer is disposed on the cladding layer, opposite the active layer, in the isolation part, between the laser part and the modulator part, and between the cladding layer and the etch stopping layer.

* * * * *